US012745655B2

(12) United States Patent
Osumi et al.

(10) Patent No.: US 12,745,655 B2
(45) Date of Patent: Sep. 22, 2026

(54) SEMICONDUCTOR DEVICE PROVIDED WITH INSULATING ELEMENT BONDED TO INSULATING SUBSTRATE

(71) Applicant: ROHM CO., LTD., Kyoto (JP)

(72) Inventors: Yoshizo Osumi, Kyoto (JP); Hiroaki Matsubara, Kyoto (JP); Tomohira Kikuchi, Kyoto (JP); Taro Nishioka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 437 days.

(21) Appl. No.: 18/470,083

(22) Filed: Sep. 19, 2023

(65) Prior Publication Data

US 2024/0014107 A1 Jan. 11, 2024

Related U.S. Application Data

(63) Continuation of application No. PCT/JP2022/008326, filed on Feb. 28, 2022.

(30) Foreign Application Priority Data

Mar. 26, 2021 (JP) ............................ JP2021-053383

(51) Int. Cl.

| | |
|---|---|
| ***H10W 70/40*** | (2026.01) |
| ***H10W 44/00*** | (2026.01) |
| ***H10W 90/00*** | (2026.01) |

(52) U.S. Cl.

CPC ....... *H10W 70/481* (2026.01); *H10W 44/501* (2026.01); *H10W 70/411* (2026.01); *H10W 70/442* (2026.01); *H10W 90/736* (2026.01); *H10W 90/756* (2026.01)

(58) Field of Classification Search

None

See application file for complete search history.

(56) References Cited

U.S. PATENT DOCUMENTS

| | | | | |
|---|---|---|---|---|
| 2016/0307854 | A1* | 10/2016 | Matsubara | H01L 23/49537 |
| 2019/0378810 | A1* | 12/2019 | Yoshioka | H01L 23/4952 |
| 2020/0168534 | A1* | 5/2020 | Bonifield | H10W 20/496 |

FOREIGN PATENT DOCUMENTS

| | | |
|---|---|---|
| EP | 4 128 343 | 2/2023 |
| JP | 7-030058 | 1/1995 |
| JP | 2015-156423 | 8/2015 |

(Continued)

OTHER PUBLICATIONS

Office Action issued in corresponding German Patent Application No. 11 2022 000 855.5, Nov. 3, 2025, 9 pages w/translation.

(Continued)

*Primary Examiner* — Nduka E Ojeh

(74) *Attorney, Agent, or Firm* — HSML P.C.

(57) ABSTRACT

A semiconductor device includes a plurality of conductive members including a die pad, a first semiconductor element and a second semiconductor element each located on the die pad, an insulating element electrically connected to the first semiconductor element and the second semiconductor element and insulating the first semiconductor element and the second semiconductor element from each other, and an insulating substrate interposed between the die pad and the insulating element and bonded to the die pad. The insulating element is bonded to the insulating substrate.

20 Claims, 26 Drawing Sheets

(56) References Cited

FOREIGN PATENT DOCUMENTS

| | | |
|---|---|---|
| JP | 2016-015393 | 1/2016 |
| JP | 2016-207714 | 12/2016 |
| WO | 2021/202074 | 10/2021 |

OTHER PUBLICATIONS

International Search Report issued in International Application No. PCT/2022/008326, May 17, 2022, 2 pages.
Written Opinion issued in International Application No. PCT/2022/008326, May 17, 2022, 3 pages.
Notice of Reasons for Refusal issued in corresponding Japanese Patent Application No. 2023-508855, Feb. 17, 2026, 5 pages w/translation.
Office Action issued in corresponding Japanese Patent Application No. 2023-508855, Dec. 9, 2025, 8 pages w/translation.
Decision of Refusal issued in corresponding Japanese Patent Application No. 2023-508855, May 19, 2026, 4 pages w/translation.

* cited by examiner

SEMICONDUCTOR DEVICE PROVIDED WITH INSULATING ELEMENT BONDED TO INSULATING SUBSTRATE

TECHNICAL FIELD

The present disclosure relates to a semiconductor device with a plurality of semiconductor elements and an insulating element that insulates the semiconductor elements from each other.

BACKGROUND ART

Semiconductor devices are used in inverter devices for electric vehicles (including hybrid vehicles) or household electrical appliances. Such an inverter device may include switching elements such as IGBTs (Insulated Gate Bipolar Transistor) or MOSFETs (Metal Oxide Semiconductor Field Effect Transistor) in addition to a semiconductor device. The semiconductor device includes a controller and a gate driver. In the inverter device, a control signal outputted from the outside is inputted to the controller of the semiconductor device. The controller converts the control signal into a PWM (Pulse Width Modulation) control signal and transmits it to the gate driver. Based on the PWM control signal, the gate driver drives e.g. six switching elements at appropriate timings. In this way, three-phase AC power for motor driving is obtained from DC power. An example of a semiconductor device (drive circuit) used in a motor drive device is disclosed in JP-A-2016-15393.

In some cases, the power supply voltage supplied to the controller and the power supply voltage supplied to the gate driver may differ from each other. In a semiconductor device with a plurality of semiconductor elements mounted in a single package, this results in a difference in power supply voltages applied to the two conduction paths, i.e., the conduction path to the controller and the conduction path to the gate driver. Therefore, an insulating element is interposed between the conduction path to the controller and the conduction path to the gate driver to improve the dielectric strength of the semiconductor device. Such an insulating element is typically mounted on a die pad together with either the controller or the gate driver. When the power supply voltages applied to the two conduction paths are significantly different, the risk of dielectric breakdown of the insulating element increases. Thus, measures to address this need to be taken.

DETAILED DESCRIPTION OF EMBODIMENTS

Figure 1:
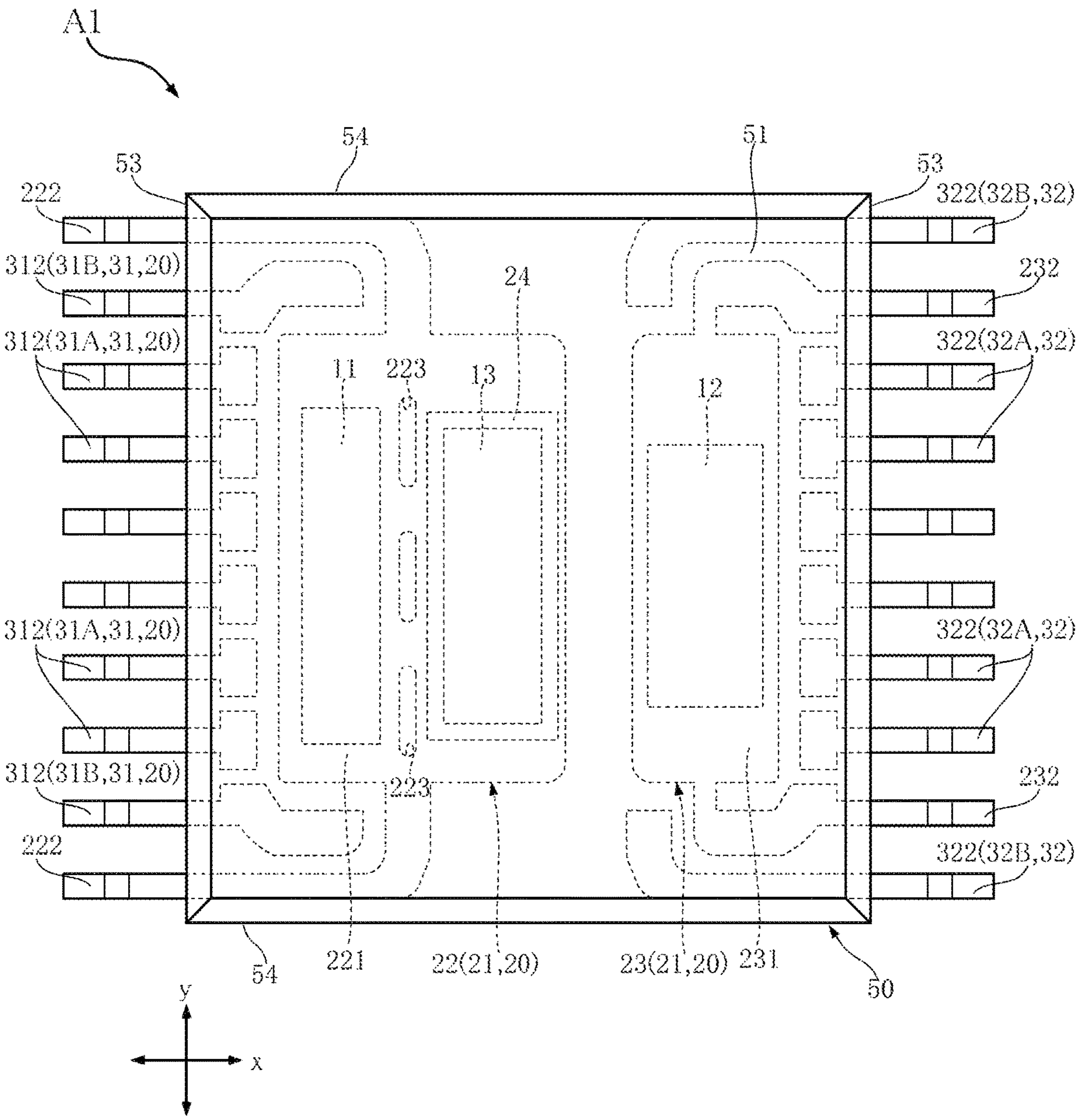
FIG. 1 is a plan view of a semiconductor device according to a first embodiment of the present disclosure.

The following describes mode for carrying out the present disclosure with reference to the accompanying drawings.

A semiconductor device A1 according to a first embodiment of the present disclosure is described below with reference to FIGS. 1 to 10. The semiconductor device A1 includes a first semiconductor element 11, a second semiconductor element 12, an insulating element 13, a plurality of conductive members 20, an insulating substrate 24, a first bonding layer 25, a second bonding layer 26, a plurality of first wires 41, a plurality of second wires 42, a plurality of third wires 43, a plurality of fourth wires 44 and a sealing resin 50. The conductive members 20 include an element support 21 (a die pad 21), a plurality of first terminals 31, and a plurality of second terminals 32. The semiconductor device A1 is configured to be surface-mounted on a wiring board of an inverter device of e.g. a vehicle such as an electric vehicle or a hybrid vehicle. The package type of the semiconductor device A1 is SOP (Small Outline Package). The package type of the semiconductor device A1 is not limited to the SOP. For convenience of understanding, the sealing resin 50 is transparent in FIG. 2. In FIG. 2, the outlines of the sealing resin 50 is shown by imaginary lines (two-dot chain lines).

In the description of the semiconductor device A1, the thickness direction of each of the first semiconductor element 11, the second semiconductor element 12 and the insulating element 13 is defined as the "thickness direction z". A direction orthogonal to the thickness direction z is defined as the "first direction x". The direction orthogonal to the thickness direction z and the first direction x is defined as the "second direction y".

The first semiconductor element 11, the second semiconductor element 12 and the insulating element 13 are the core components for the functions of the semiconductor device A1. In the semiconductor device A1, the first semiconductor element 11, the second semiconductor element 12 and the insulating element 13 are individual elements. In the first direction x, the second semiconductor element 12 is located on the opposite side of the first semiconductor element 11 relative to the insulating element 13. As viewed in the thickness direction z, each of the first semiconductor element 11, the second semiconductor element 12 and the insulating element 13 has a rectangular shape with the long side in the second direction y.

The first semiconductor element 11 is a controller (a controlling element) for a gate driver that drives switching elements such as IGBTs or MOSFETs. The first semiconductor element 11 includes a circuit for converting control signals inputted from e.g. an ECU into PWM control signals, a transmission circuit for transmitting the PWM control signals to the second semiconductor element 12, and a receiving circuit for receiving electric signals from the second semiconductor element 12.

The second semiconductor element 12 is a gate driver (a driving element) for driving the switching elements. The second semiconductor element 12 includes a receiving circuit for receiving PWM control signals, a circuit for driving the switching elements based on the PWM control signals, and a transmission circuit for transmitting electric signals to the first semiconductor element 11. Examples of the electric signals include an output signal from a temperature sensor disposed near the motor.

The insulating element 13 is an element that transmits PWM control signals and other electric signals in an insulated condition. In the semiconductor device A1, the insulating element 13 is of an inductive type. An example of the inductive type insulating element 13 is an insulation transformer. An insulation transformer includes two inductively coupled inductors (coils) to realize transmission of electric signals in an insulated state. The insulating element 13 has a substrate made of silicon. Inductors made of copper (Cu) are formed on the substrate. The inductors include a transmitting-side inductor and a receiving-side inductor, which are stacked in the thickness direction z. A dielectric layer made of silicon dioxide ($SiO_2$), for example, is interposed between the transmitting-side inductor and the receiving-side inductor. The dielectric layer provides electrical insulation between the transmitting-side inductor and the receiving-side inductor. Alternatively, the insulating element 13 may be of a capacitive type. An example of a capacitive insulating element 13 is a capacitor.

In the semiconductor device A1, the voltage applied to the first semiconductor element 11 and the voltage applied to the second semiconductor element 12 are different from each other. Thus, there is a potential difference between the first semiconductor element 11 and the second semiconductor element 12. In the semiconductor device A1, the power supply voltage supplied to the second semiconductor element 12 is higher than that supplied to the first semiconductor element 11.

In the semiconductor device A1, the insulating element 13 provides insulation between a first circuit including the first semiconductor element 11 as a component and a second circuit including the second semiconductor element 12 as a component. The insulating element 13 is electrically connected to the first circuit and the second circuit. The components of the first circuit include a first die pad 22, the first terminals 31, the first wires 41 and the third wires 43, described later, in addition to the first semiconductor element 11. The components of the second circuit include a second die pad 23, the second terminals 32, the second wires 42 and the fourth wires 44, described later, in addition to the second semiconductor element 12. The first circuit and the second circuit have different potentials. In the semiconductor device A1, the potential of the second circuit is higher than the potential of the first circuit. In this state, the insulating element 13 relays signals between the first circuit and the second circuit. For example, in an inverter device for an electric vehicle or a hybrid vehicle, the voltage applied to the ground of the second semiconductor element 12 may transiently become 600 V or higher while the voltage applied to the ground of the first semiconductor element 11 is about 0 V.

Figure 6:
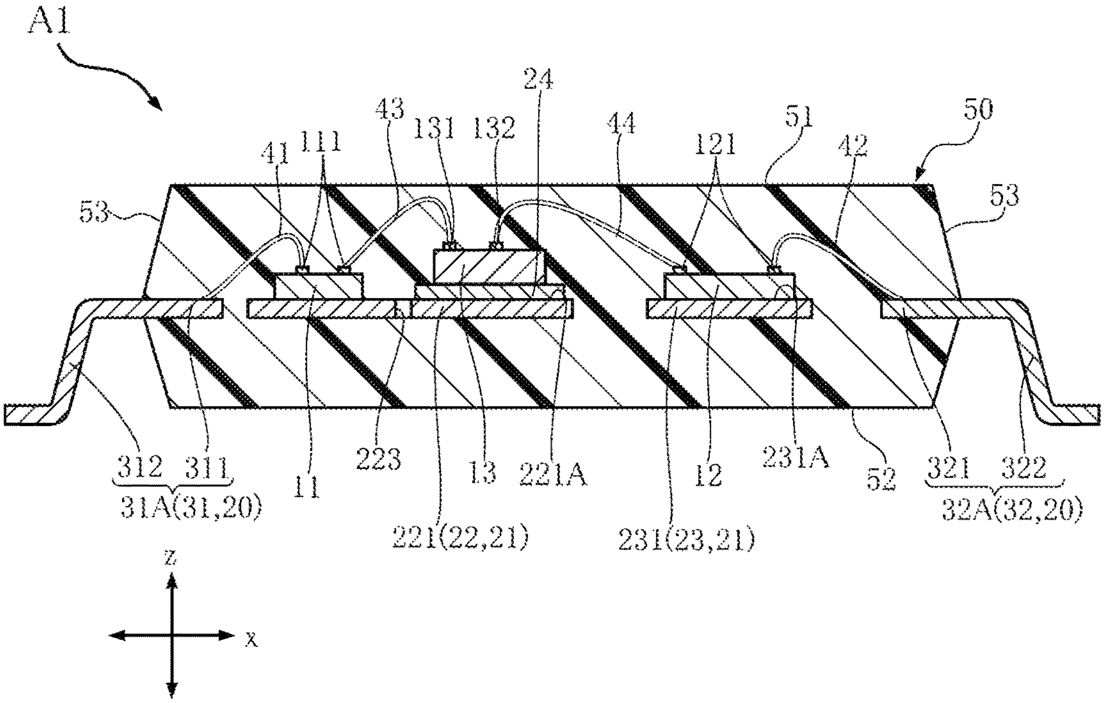
FIG. 6 is a sectional view taken along line VI-VI in FIG. 2.

As shown in FIGS. 2 and 6, the first semiconductor element 11 has a plurality of first electrodes 111. The first electrodes 111 are provided on the upper surface of the first semiconductor element 11 (i.e., the surface facing in the same direction as a first mounting surface 221A of a first pad portion 221 of the first die pad 22 described later). The composition of the first electrodes 111 includes aluminum (A1), for example. In other words, each first electrode 111 contains aluminum. The first electrodes 111 electrically conduct to the circuit formed in the first semiconductor element 11.

Figure 8:
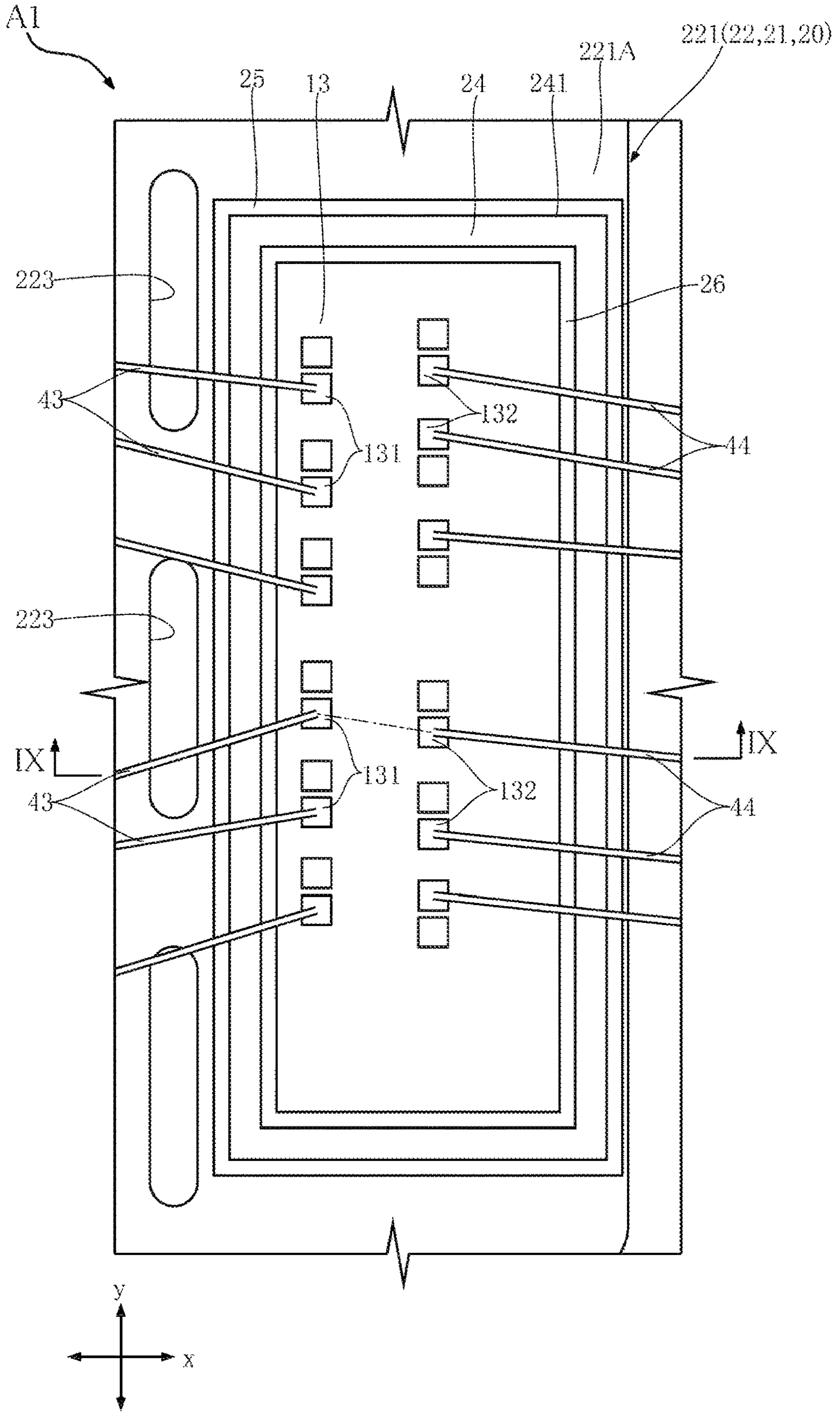
FIG. 8 is a partially enlarged view in which a portion of FIG. 2 is enlarged.
Figure 9:
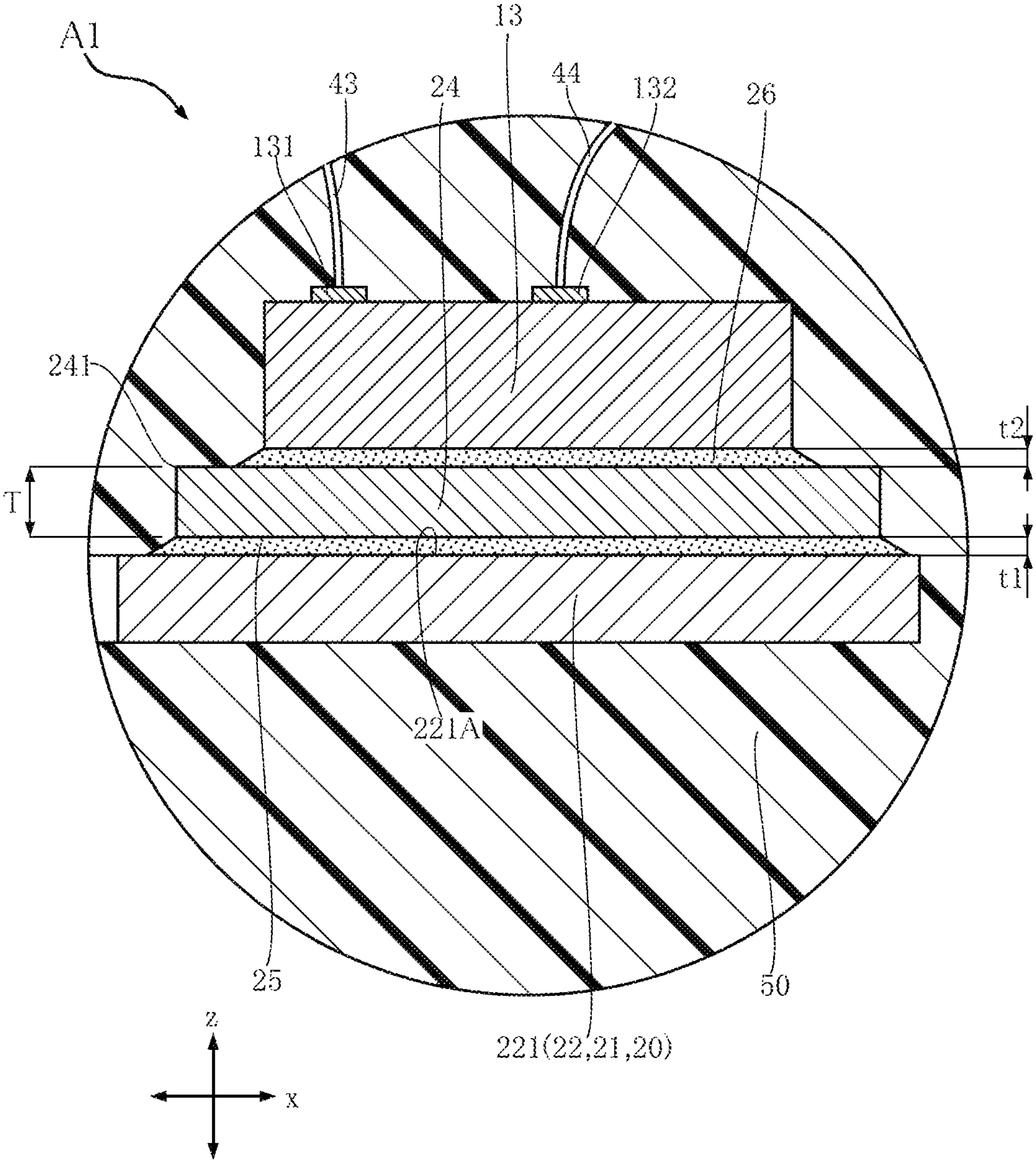
FIG. 9 is a sectional view taken along line IX-IX in FIG. 8.

As shown in FIGS. 2 and 6, the insulating element 13 is located between the first semiconductor element 11 and the second semiconductor element 12 in the first direction x. As shown in FIGS. 8 and 9, the insulating element 13 has a plurality of first relay electrodes 131 and a plurality of second relay electrodes 132. The first relay electrodes 131 and the second relay electrodes 132 are provided on the upper surface (the surface facing in the same direction as the first mounting surface 221A described above) of the insulating element 13. The first relay electrodes 131 are arranged along the second direction y and located closer to the first semiconductor element 11 than is the second semiconductor element 12 in the first direction x. The second relay electrodes 132 are arranged along the second direction y and located closer to the second semiconductor element 12 than is the first semiconductor element 11 in the first direction x.

Figure 10:
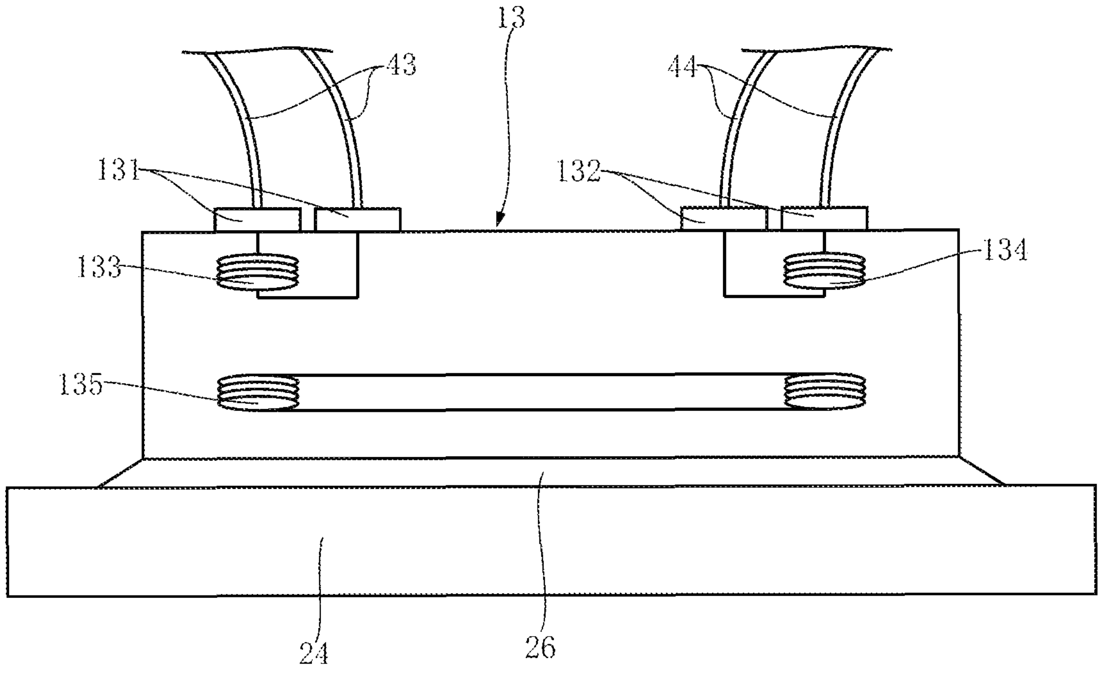
FIG. 10 is a schematic view of the insulating element and the insulating substrate shown in FIG. 9.

As shown in FIG. 10, the insulating element 13 further has a first transmitter/receiver 133, a second transmitter/receiver 134, and a relay unit 135. The first transmitter/receiver 133, the second transmitter/receiver 134, and the relay unit 135 are inductors. The first transmitter/receiver 133 and the second transmitter/receiver 134 are spaced apart from each other in the first direction x. The first transmitter/receiver 133 electrically conducts to the first relay electrodes 131.

The first transmitter/receiver 133 also electrically conducts to the first semiconductor element 11 via the third wires 43. The second transmitter/receiver 134 electrically conducts to the second relay electrodes 132. The second transmitter/receiver 134 also electrically conducts to the second semiconductor element 12 via the fourth wires 44.

As shown in FIG. 10, the relay unit 135 is spaced apart from the first transmitter/receiver 133 and the second transmitter/receiver 134 in the thickness direction z. A dielectric layer (not shown) made of silicon dioxide, for example, is interposed between the relay unit 135 and the first and the second transmitter/receivers 133 and 134. The relay unit 135 transmits/receives signals between the first transmitter/receiver 133 and the second transmitter/receiver 134. In the thickness direction z, the relay unit 135 is located closer to the insulating substrate 24 than are the first transmitter/receiver 133 and the second transmitter/receiver 134. The potential of the relay unit 135 takes a value between the potential of the first transmitter/receiver 133 and the potential of the second transmitter/receiver 134.

As shown in FIGS. 2 and 6, the second semiconductor element 12 has a plurality of second electrodes 121. The second electrodes 121 are provided on the upper surface of the second semiconductor element 12 (i.e., the surface facing in the same direction as a second mounting surface 231A of a second pad portion 231 of the second die pad 23 described later). The second electrodes 121 may contain aluminum. The second electrodes 121 electrically conduct to the circuit formed in the second semiconductor element 12.

The conductive members 20 form conduction paths between the wiring board on which the semiconductor device A1 is mounted and the first semiconductor element 11, the insulating element 13 and the second semiconductor element 12. The conductive members 20 are formed from a same lead frame. The lead frame contains copper. As described above, the conductive members 20 include the element support 21 (the die pad 21), the first terminals 31 and the second terminals 32. In the semiconductor device A1, the element support 21 (the die pad 21) includes a first die pad 22 and a second die pad 23.

Figure 2:
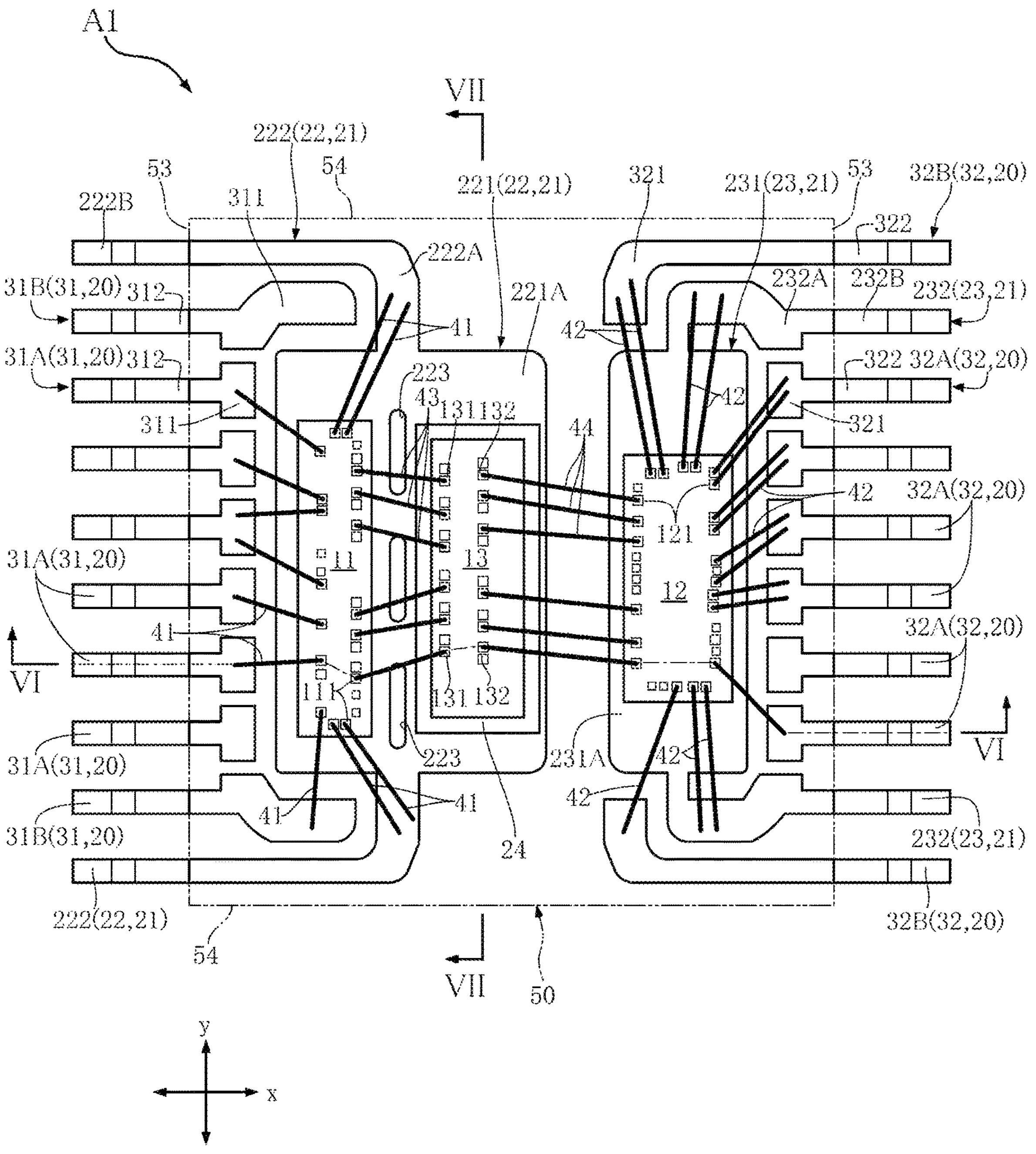
FIG. 2 is a plan view corresponding to FIG. 1, as seen through a sealing resin.

As shown in FIGS. 1 and 2, the first die pad 22 and the second die pad 23 are spaced apart from each other in the first direction x. In the semiconductor device A1, the first semiconductor element 11 and the insulating substrate 24 are bonded to the first die pad 22, and the second semiconductor element 12 is bonded to the second die pad 23. The voltage applied to the second die pad 23 differs from the voltage applied to the first die pad 22. In the semiconductor device A1, the voltage applied to the second die pad 23 is higher than the voltage applied to the first die pad 22.

Figure 7:
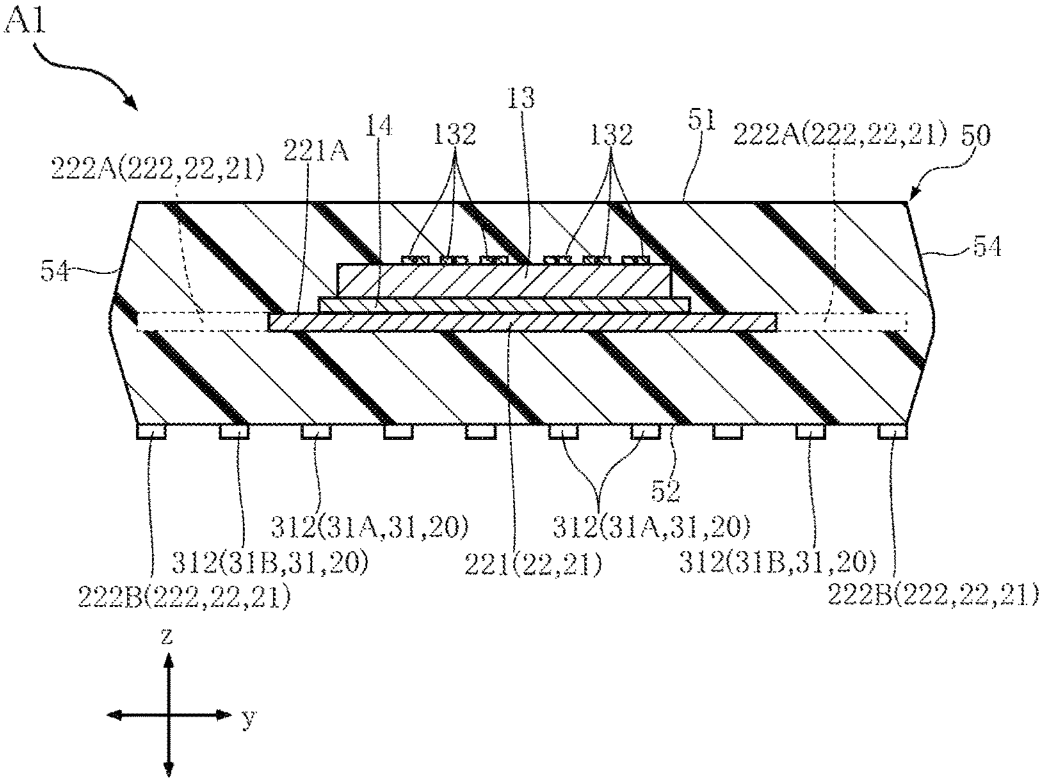
FIG. 7 is a sectional view taken along line VII-VII in FIG. 2.

As shown in FIG. 2, the first die pad 22 has the first pad portion 221 and two first suspension lead portions 222. The first semiconductor element 11 is located on the first pad portion 221. As shown in FIGS. 6 and 7, the first pad portion 221 has a first mounting surface 221A facing in the thickness direction z. The first semiconductor element 11 is bonded to the first mounting surface 221A via a conductive bonding material (such as solder or metal paste) not shown. The first pad portion 221 is covered with the sealing resin 50. The thickness of the first pad portion 221 is equal to or greater than 150 μm and equal to or less than 200 μm, for example.

As shown in FIGS. 2 and 6, the first pad portion 221 is formed with a plurality of through-holes 223. Each of the through-holes 223 penetrates the first pad portion 221 in the thickness direction z and extends along the second direction y. As viewed in the thickness direction z, at least one of the through-holes 223 is located between the first semiconductor element 11 and the insulating substrate 24. The through-holes 223 are arranged along the second direction y.

Figure 3:
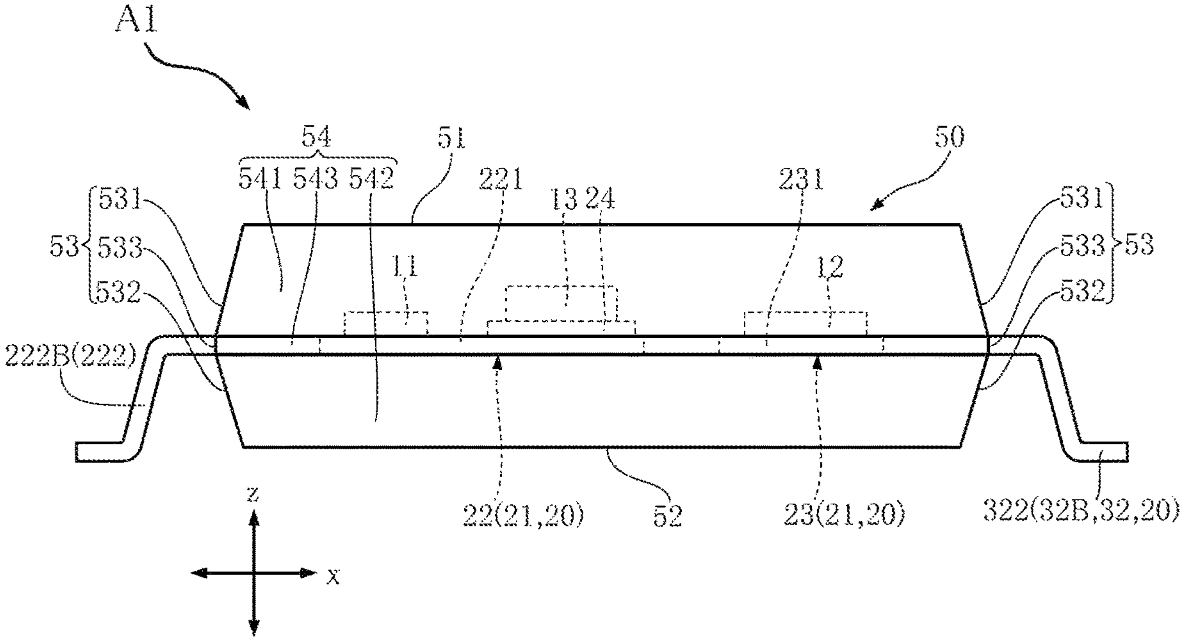
FIG. 3 is a front view of the semiconductor device shown in FIG. 1.

As shown in FIG. 2, the two first suspension lead portions 222 are connected to opposite ends in the second direction y of the first pad portion 221. The two first suspension lead portions 222 each have a covered portion 222A and an exposed portion 222B. The covered portion 222A is connected to the first pad portion 221 and covered with the sealing resin 50. The covered portion 222A includes a section extending in the first direction x. The exposed portion 222B is connected to the covered portion 222A and exposed from the sealing resin 50. As viewed in the thickness direction z, the exposed portion 222B extends along the first direction x. As shown in FIG. 3, the exposed portion 222B is bent into a gull-wing profile as viewed in the second direction y. The surface of the exposed portion 222B may be plated with tin (Sn), for example.

As shown in FIG. 2, the second die pad 23 has a second pad portion 231 and two second suspension lead portions 232. The second semiconductor element 12 is located on the second pad portion 231. As shown in FIG. 6, the second pad portion 231 has a second mounting surface 231A facing in the thickness direction z. The second semiconductor element 12 is bonded to the second mounting surface 231A via a conductive bonding material (such as solder or metal paste) not shown. The second pad portion 231 is covered with the sealing resin 50. The thickness of the second pad portion 231 is equal to or greater than 150 μm and equal to or less than 200 μm, for example. The area of the second pad portion 231 is smaller than the area of the first pad portion 221 of the first die pad 22. As viewed in the first direction x, the second pad portion 231 overlaps with the first pad portion 221.

As shown in FIG. 2, the two second suspension lead portions 232 extend outward from opposite ends in the second direction y of the second pad portion 231. The two second suspension lead portions 232 each have a covered portion 232A and an exposed portion 232B. The covered portion 232A is connected to the second pad portion 231 and covered with the sealing resin 50. The covered portion 232A includes a section extending in the first direction x. The exposed portion 232B is connected to the covered portion 232A and exposed from the sealing resin 50. As viewed in the thickness direction z, the exposed portion 232B extends along the first direction x. As shown in FIG. 3, the exposed portion 232B is bent into a gull-wing profile as viewed in the second direction y. The surface of the exposed portion 232B may be plated with tin, for example.

As shown in FIGS. 2, 6 and 7, the insulating substrate 24 is bonded to the die pad 21. As viewed in the thickness direction z, the insulating substrate 24 is located inward from the periphery of the die pad 21. In the semiconductor device A1, the insulating substrate 24 is bonded to the first pad portion 221 of the first die pad 22. The insulating substrate 24 is made of a material containing alumina ($Al_2O_3$), for example. The insulating substrate 24 is rectangular as viewed in the thickness direction z. The insulating element 13 is bonded to the insulating substrate 24. The insulating substrate 24 is interposed between the die pad 21 (the first pad portion 221 of the first die pad 22) and the insulating element 13.

As shown in FIG. 9, the first bonding layer 25 is interposed between the die pad 21 (the first pad portion 221 of the first die pad 22) and the insulating substrate 24. In the semiconductor device A1, the insulating substrate 24 is bonded to the first mounting surface 221A of the first pad portion 221 via the first bonding layer 25. The thickness t1 of the first bonding layer 25 is smaller than the thickness T of the insulating substrate 24. As shown in FIGS. 8 and 9, in the semiconductor device A1, the first bonding layer 25 includes a portion sticking out of the periphery 241 of the insulating substrate 24 as viewed in the thickness direction z. The first bonding layer 25 has an electrically insulating property. The first bonding layer 25 is made of a material containing epoxy resin, for example.

As shown in FIG. 9, the second bonding layer 26 is interposed between the insulating substrate 24 and the insulating element 13. The insulating element 13 is bonded to the insulating substrate 24 via the second bonding layer 26. The thickness t2 of the second bonding layer 26 is smaller than the thickness T of the insulating substrate 24. In the semiconductor device A1, as shown in FIG. 8, the area of the second bonding layer 26 is smaller than the area of the first bonding layer 25 as viewed in the thickness direction z. The second bonding layer 26 has an electrically insulating property. The second bonding layer 26 is made of a material containing epoxy resin, for example.

As shown in FIGS. 1 and 2, the first terminals 31 are located on one side in the first direction x. Specifically, the first terminals 31 are located on the opposite side of the second pad portion 231 of the second die pad 23 relative to the first pad portion 221 of the first die pad 22 in the first direction x. The first terminals 31 are arranged along the second direction y. At least one of the first terminals 31 electrically conducts to the first semiconductor element 11 via a third wire 43. The first terminals 31 include a plurality of first intermediate terminals 31A and two first-side terminals 31B. The two first-side terminals 31B flank the first intermediate terminals 31A in the second direction y. Each of the two first-side terminals 31B is located between one of the two first suspension lead portions 222 of the first die pad 22 and the first intermediate terminal 31A closest to the first suspension lead portion 222 in the second direction y.

As shown in FIGS. 2 and 6, each of the first terminals 31 has a covered portion 311 and an exposed portion 312. The covered portions 311 are covered with the sealing resin 50. The dimension of the covered portion 311 of each of the two first-side terminals 31B in the first direction x is larger than the dimension of the covered portion 311 of each of the first intermediate terminals 31A in the first direction x.

As shown in FIGS. 2 and 6, the exposed portions 312 are connected to the covered portions 311 and exposed from the sealing resin 50. As viewed in the thickness direction z, the exposed portions 312 extend along the first direction x. The exposed portions 312 are bent into a gull-wing profile as viewed in the second direction y. The shape of the exposed portions 312 is the same as the exposed portion 222B of each of the two first suspension lead portions 222 of the first die pad 22. The surface of the exposed portion 312 may be plated with tin, for example.

As shown in FIGS. 1 and 2, the second terminals 32 are located on the other side in the first direction x. Specifically, the second terminals 32 are located on the opposite side of the first terminals 31 relative to the first pad portion 221 of the first die pad 22 in the first direction x. The second terminals 32 are arranged along the second direction y. At least one of the second terminals 32 electrically conducts to the second semiconductor element 12 via a fourth wire 44. The second terminals 32 include a plurality of second intermediate terminals 32A and two second-side terminals 32B. The two second-side terminals 32B flank the second intermediate terminals 32A in the second direction y. In the second direction y, each of the two second suspension lead portions 232 of the second die pad 23 is located between one of the two second-side terminals 32B and the second intermediate terminal 32A closest to the second-side terminal 32B.

As shown in FIGS. 2 and 6, each of the second terminals 32 has a covered portion 321 and an exposed portion 322. The covered portions 321 are covered with the sealing resin 50. The dimension of the covered portion 321 of each of the two second-side terminals 32B in the first direction x is larger than the dimension of the covered portion 321 of each of the second intermediate terminals 32A in the first direction x.

As shown in FIGS. 2 and 6, the exposed portions 322 are connected to the covered portions 321 and exposed from the sealing resin 50. As viewed in the thickness direction z, the exposed portions 322 extend along the first direction x. As shown in FIG. 3, the exposed portions 322 are bent into a gull-wing profile as viewed in the second direction y. The shape of the exposed portions 322 is the same as the exposed portion 232B of each of the two second suspension lead portions 232 of the second die pad 23. The surface of the exposed portion 322 may be plated with tin, for example.

The first wires 41, the second wires 42, the third wires 43 and the fourth wires 44 form, together with the conductive members 20, conduction paths for the first semiconductor element 11, the second semiconductor element 12 and the insulating element 13 to perform predetermined functions.

As shown in FIGS. 2 and 6, some of the first wires 41 are bonded to the first electrodes 111 of the first semiconductor element 11 and the covered portions 311 of the first terminal 31. Thus, at least one of the first terminals 31 electrically conducts to the first semiconductor element 11. At least one of the first wires 41 is bonded to one of the first electrodes 111 and one of the covered portions 222A of the two first suspension lead portions 222 of the first die pad 22. Thus, at least one of the two first suspension lead portions 222 electrically conducts to the first semiconductor element 11. With such a configuration, at least one of the two first suspension lead portions 222 provides a ground terminal of the first semiconductor element 11. Each of the first wires 41 contains gold (Au). Alternatively, each of the first wires 41 may contain copper.

As shown in FIGS. 2 and 6, some of the second wires 42 are bonded to the second electrodes 121 of the second semiconductor element 12 and the covered portions 321 of the second terminals 32. Thus, at least one of the second terminals 32 electrically conducts to the second semiconductor element 12. Also, at least one of the second wires 42 is bonded to one of the second electrodes 121 and one of the covered portions 232A of the two second suspension lead portions 232 of the second die pad 23. Thus, at least one of the two second suspension lead portions 232 electrically conducts to the second semiconductor element 12. With such a configuration, at least one of the two second suspension lead portions 232 provides a ground terminal of the second semiconductor element 12. Each of the second wires 42 contains gold. Alternatively, each of the second wires 42 may contain copper.

As shown in FIGS. 2 and 6, the third wires 43 are bonded to the first relay electrodes 131 of the insulating element 13 and the first electrodes 111 of the first semiconductor element 11. Thus, the first semiconductor element 11 and the insulating element 13 electrically conduct to each other. The third wires 43 are arranged along the second direction y. Each of the third wires 43 contains gold.

As shown in FIGS. 2 and 6, the fourth wires 44 are bonded to the second relay electrodes 132 of the insulating element 13 and the second electrodes 121 of the second semiconductor element 12. Thus, the second semiconductor element 12 and the insulating element 13 electrically conduct to each other. The fourth wires 44 are arranged along the second direction y. In the semiconductor device A1, the fourth wires 44 extend across the gap between the first pad portion 221 of the first die pad 22 and the second pad portion 231 of the second die pad 23. Each of the fourth wires 44 contains gold.

As shown in FIG. 1, the sealing resin 50 covers the first semiconductor element 11, the second semiconductor element 12, the insulating element 13 and a part of each of the conductive members 20. The sealing resin 50 also covers the first wires 41, the second wires 42, the third wires 43 and the fourth wires 44. The sealing resin 50 has an electrically insulating property. The sealing resin 50 is made of a material containing epoxy resin, for example. The sealing resin 50 is rectangular as viewed in the thickness direction z.

Figure 4:
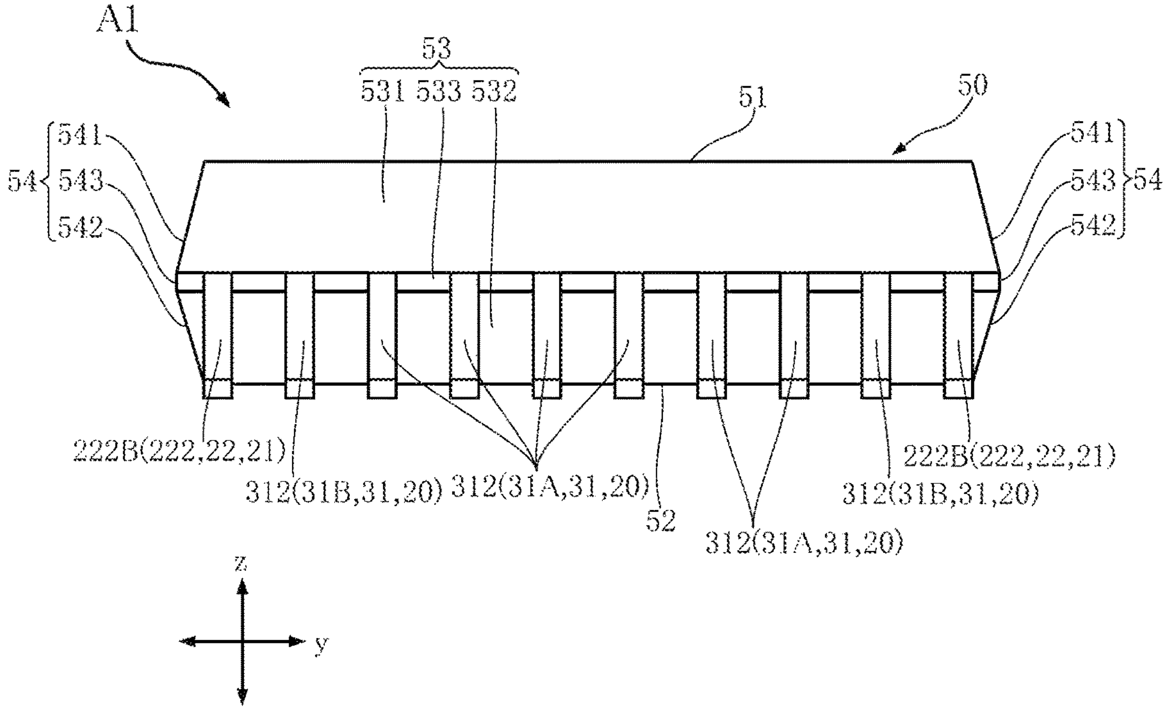
FIG. 4 is a left side view of the semiconductor device shown in FIG. 1.
Figure 5:
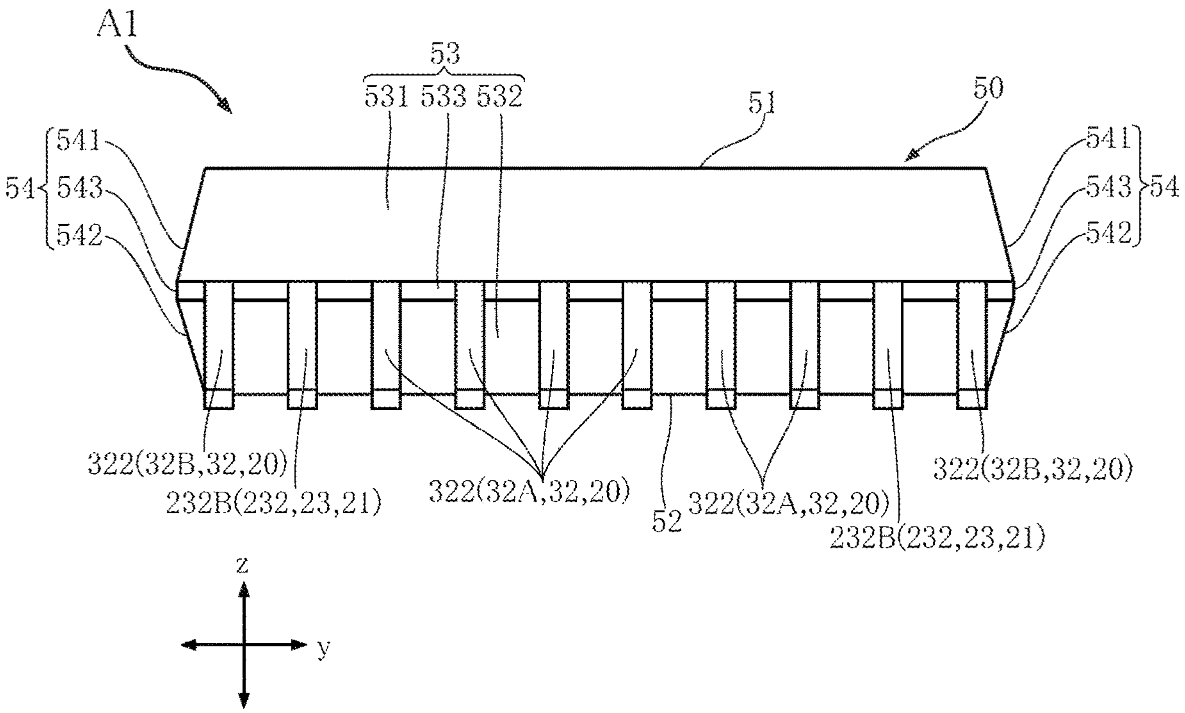
FIG. 5 is a right side view of the semiconductor device shown in FIG. 1.

As shown in FIGS. 3 to 5, the sealing resin 50 has a top surface 51, a bottom surface 52, a pair of first side surfaces 53 and a pair of second side surfaces 54.

As shown in FIGS. 3 to 5, the top surface 51 and the bottom surface 52 are spaced apart from each other in the thickness direction z. The top surface 51 and the bottom surface 52 face away from each other in the thickness direction z. Each of the top surface 51 and the bottom surface 52 is flat (or generally flat).

As shown in FIGS. 3 to 5, the pair of first side surfaces 53 are connected to the top surface 51 and the bottom surface 52 and spaced apart from each other in the first direction x. The exposed portions 222B of the two first suspension lead portions 222 of the first die pad 22 and the exposed portions 312 of the first terminals 31 are exposed from one of the pair of first side surfaces 53 that is located on one side in the first direction x. The exposed portions 232B of the two second suspension lead portions 232 of the second die pad 23 and the exposed portions 322 of the second terminals 32 are exposed from the other one of the first side surfaces 53 that is located on the other side in the first direction x.

As shown in FIGS. 3 to 5, each of the pair of first side surfaces 53 includes a first upper portion 531, a first lower portion 532 and a first intermediate portion 533. The first upper portion 531 is connected to the top surface 51 on one side in the thickness direction z and connected to the first intermediate portion 533 on the other side in the thickness direction z. The first upper portion 531 is inclined with respect to the top surface 51. The first lower portion 532 is connected to the bottom surface 52 on one side in the thickness direction z and connected to the first intermediate portion 533 on the other side in the thickness direction z. The first lower portion 532 is inclined with respect to the bottom surface 52. The first intermediate portion 533 is connected to the first upper portion 531 on one side in the thickness direction z and connected to the first lower portion 532 on the other side in the thickness direction z. The in-plane direction of the first intermediate portion 533 may be defined by the thickness direction z and the second direction y. The first intermediate portion 533 is located outside the top surface 51 and the bottom surface 52 as viewed in the thickness direction z. The exposed portions 222B of the two first suspension lead portions 222 of the first die pad 22, the exposed portions 232B of the two second suspension lead portions 232 of the second die pad 23, the exposed portions 312 of the first terminals 31 and the exposed portions 322 of the second terminals 32 are exposed from the first intermediate portions 533 of the pair of first side surfaces 53.

As shown in FIGS. 3 to 5, the pair of second side surfaces 54 are connected to the top surface 51 and the bottom surface 52 and spaced apart from each other in the second direction y. As shown in FIG. 1, the first die pad 22, the second die pad 23, the first terminals 31 and the second terminals 32 are spaced apart from the pair of second side surfaces 54.

As shown in FIGS. 3 to 5, each of the pair of second side surfaces 54 includes a second upper portion 541, a second lower portion 542 and a second intermediate portion 543. The second upper portion 541 is connected to the top surface 51 on one side in the thickness direction z and connected to the second intermediate portion 543 on the other side in the thickness direction z. The second upper portion 541 is inclined with respect to the top surface 51. The second lower portion 542 is connected to the bottom surface 52 on one side in the thickness direction z and connected to the second intermediate portion 543 on the other side in the thickness direction z. The second lower portion 542 is inclined with respect to the bottom surface 52. The second intermediate portion 543 is connected to the second upper portion 541 on one side in the thickness direction z and connected to the second lower portion 542 on the other side in the thickness direction z. The in-plane direction of the second intermediate portion 543 may be defined by the thickness direction z and the first direction x. The second intermediate portion 543 is located outside the top surface 51 and the bottom surface 52 as viewed in the thickness direction z.

Generally, in motor driver circuits of inverter devices, a half-bridge circuit that includes a low-side (low-potential side) switching element and a high-side (high-potential side) switching element is configured. An example in which these switching elements are MOSFETs is described below. In the low-side switching element, the reference potentials of the source of the switching element and the gate driver that drives the switching device are both ground. On the other hand, in the high-side switching element, the reference potentials of the source of the switching element and the gate driver that drives the switching element both correspond to the potential at the output node of the half-bridge circuit. Because the potential at the output node changes in response to the operation of the high-side switching element and the low-side switching elements, the reference potential of the gate driver that drives the high-side switching element changes. When the high-side switching element is ON, the reference potential is equivalent to the voltage applied to the drain of the high-side switching element (e.g., 600 V or higher). In semiconductor device A1, the ground of the first semiconductor element 11 and the ground of the second semiconductor element 12 are separated. Thus, when the semiconductor device A1 is used as a gate driver for driving the high-side switching element, a voltage equivalent to the voltage applied to the drain of the high-side switching element is transiently applied to the ground of the second semiconductor element 12.

A semiconductor device A11 as a first variation of the semiconductor device A1 is described below with reference to FIGS. 11 and 12. The semiconductor device A11 differs from the semiconductor device A1 in configuration of the first bonding layer 25 and the second bonding layer 26.

Figure 11:
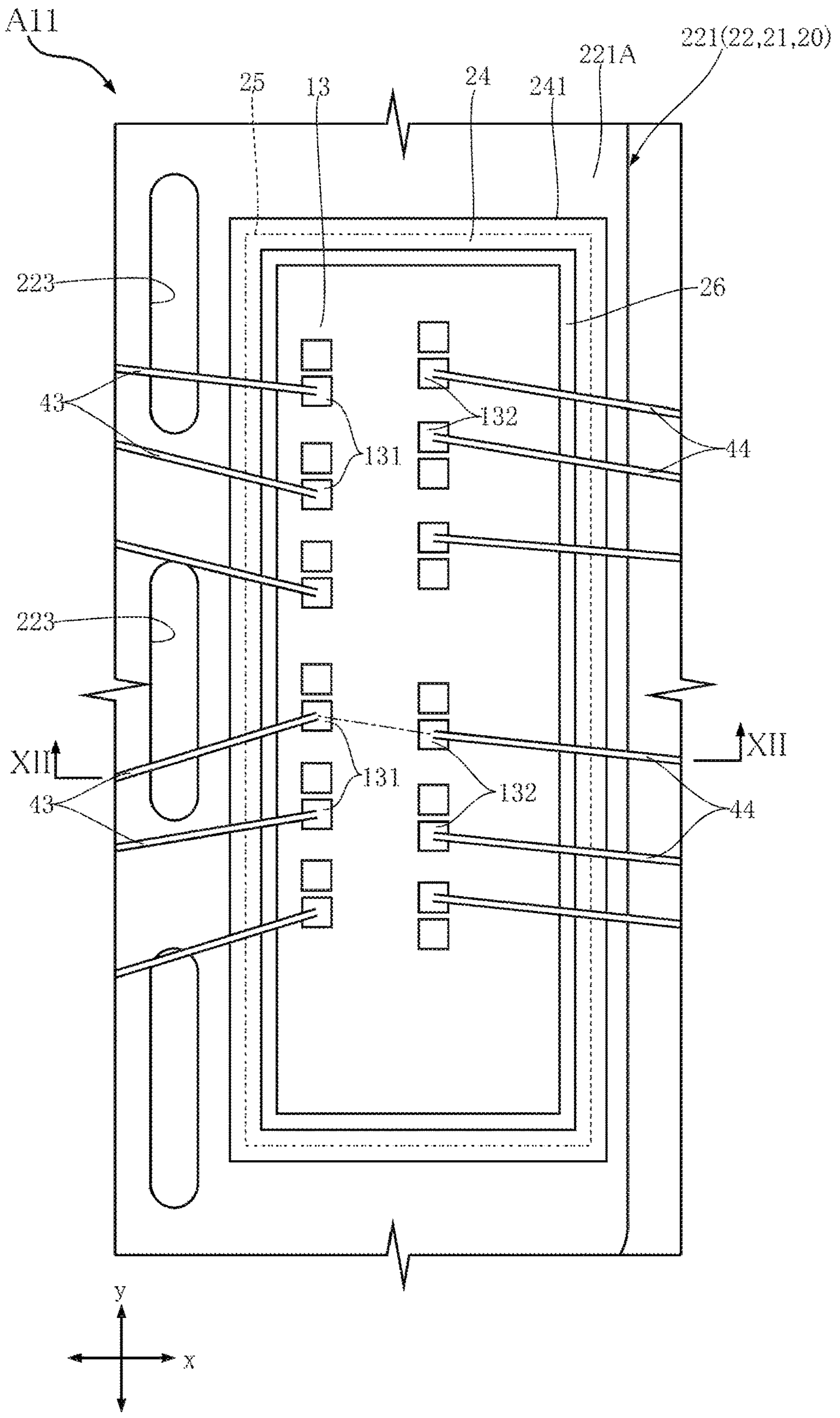
FIG. 11 is a partially enlarged plan view of a semiconductor device according to a first variation of the first embodiment of the present disclosure, as seen through a sealing resin.
Figure 12:
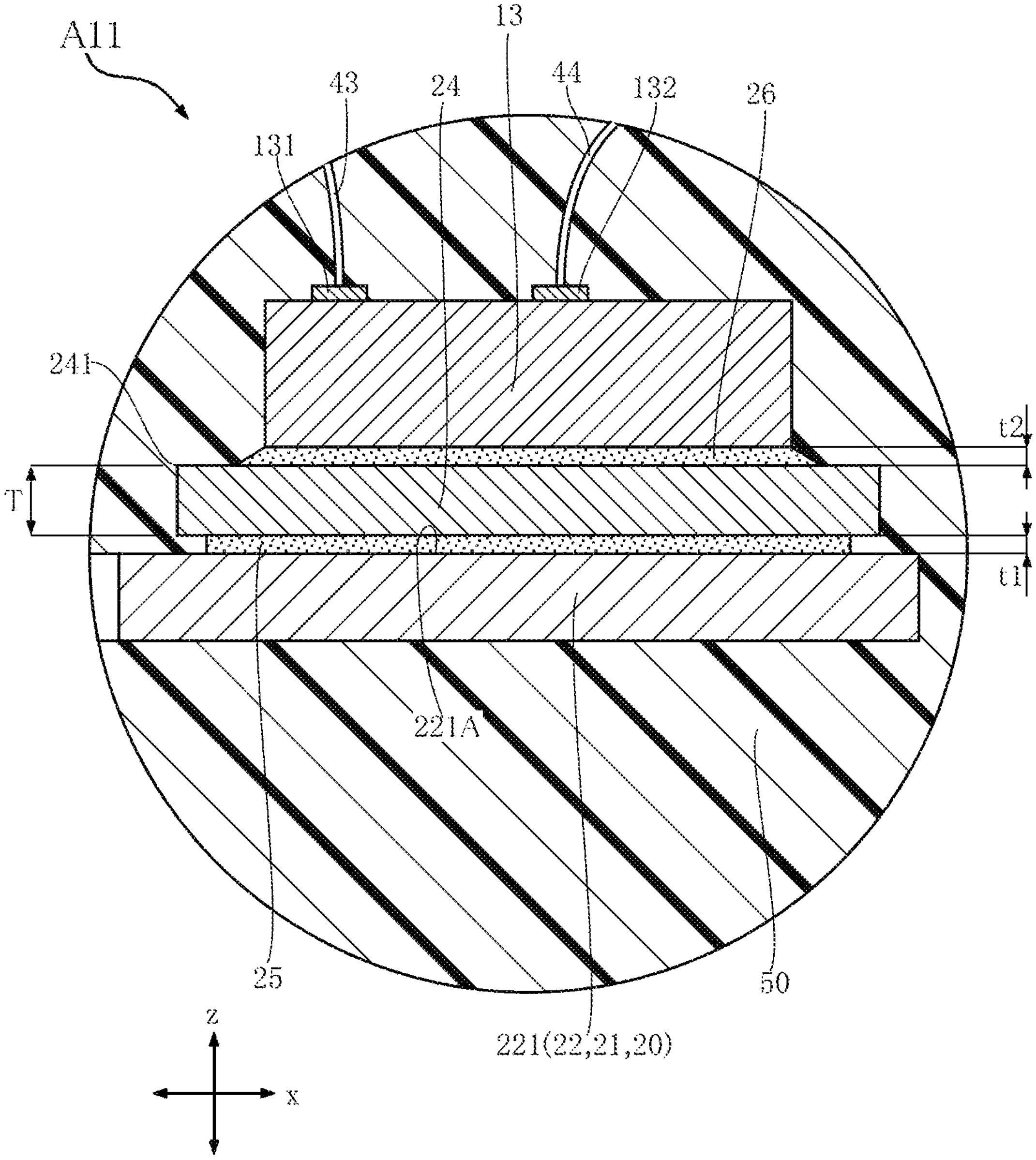
FIG. 12 is a sectional view taken along line XII-XII in FIG. 11.

As shown in FIGS. 11 and 12, in the semiconductor device A11, the first bonding layer 25 is located inward from the periphery 241 of the insulating substrate 24 as viewed in the thickness direction z. As shown in FIG. 11, the area of the second bonding layer 26 is smaller than the area of the first bonding layer 25 as viewed in the thickness direction z.

A semiconductor device A12 as a second variation of the semiconductor device A1 is described below with reference to FIGS. 13 and 14. The semiconductor device A12 differs from the semiconductor device A1 in configuration of the first bonding layer 25 and the second bonding layer 26.

Figure 13:
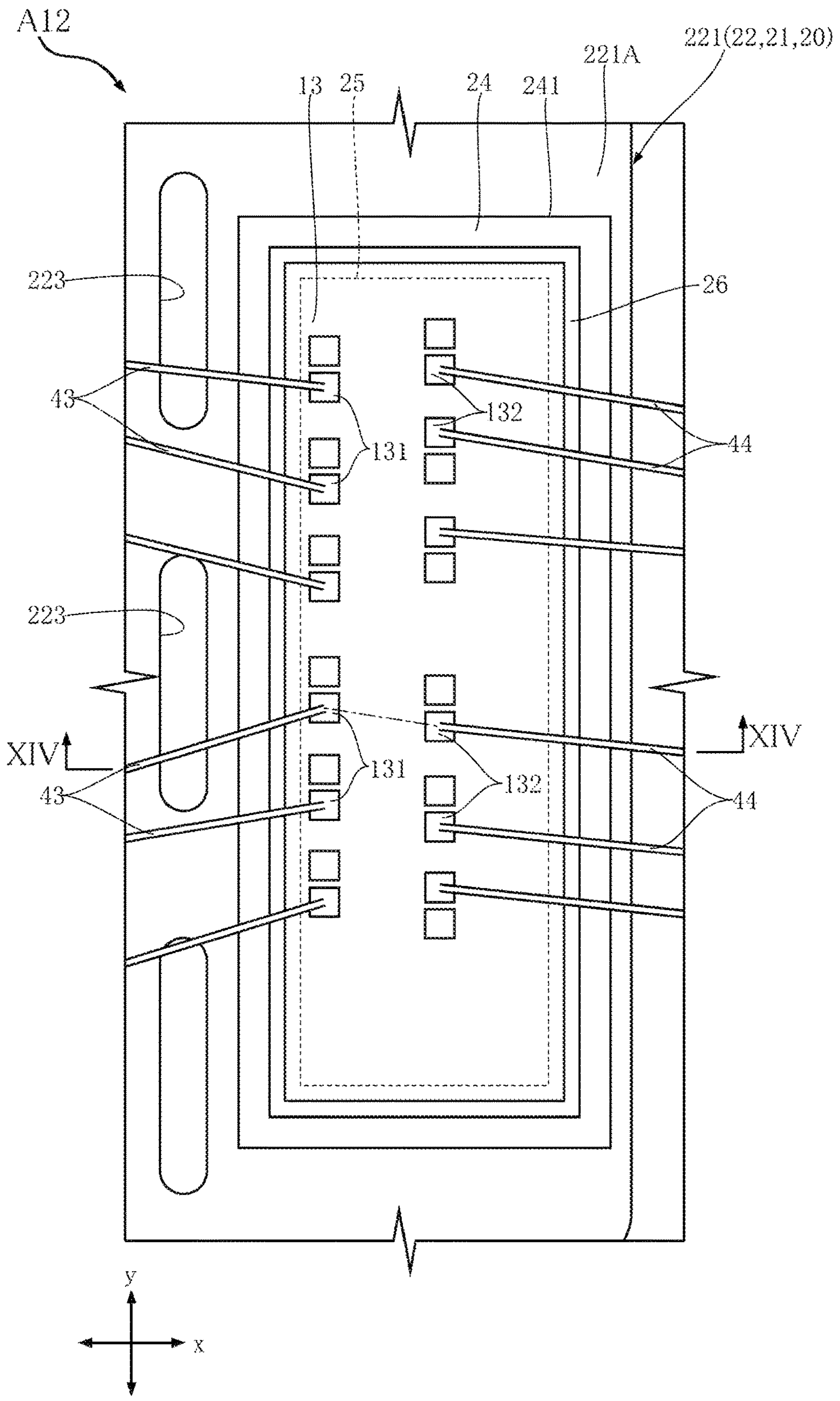
FIG. 13 is a partially enlarged plan view of a semiconductor device according to a second variation of the first embodiment of the present disclosure, as seen through a sealing resin.
Figure 14:
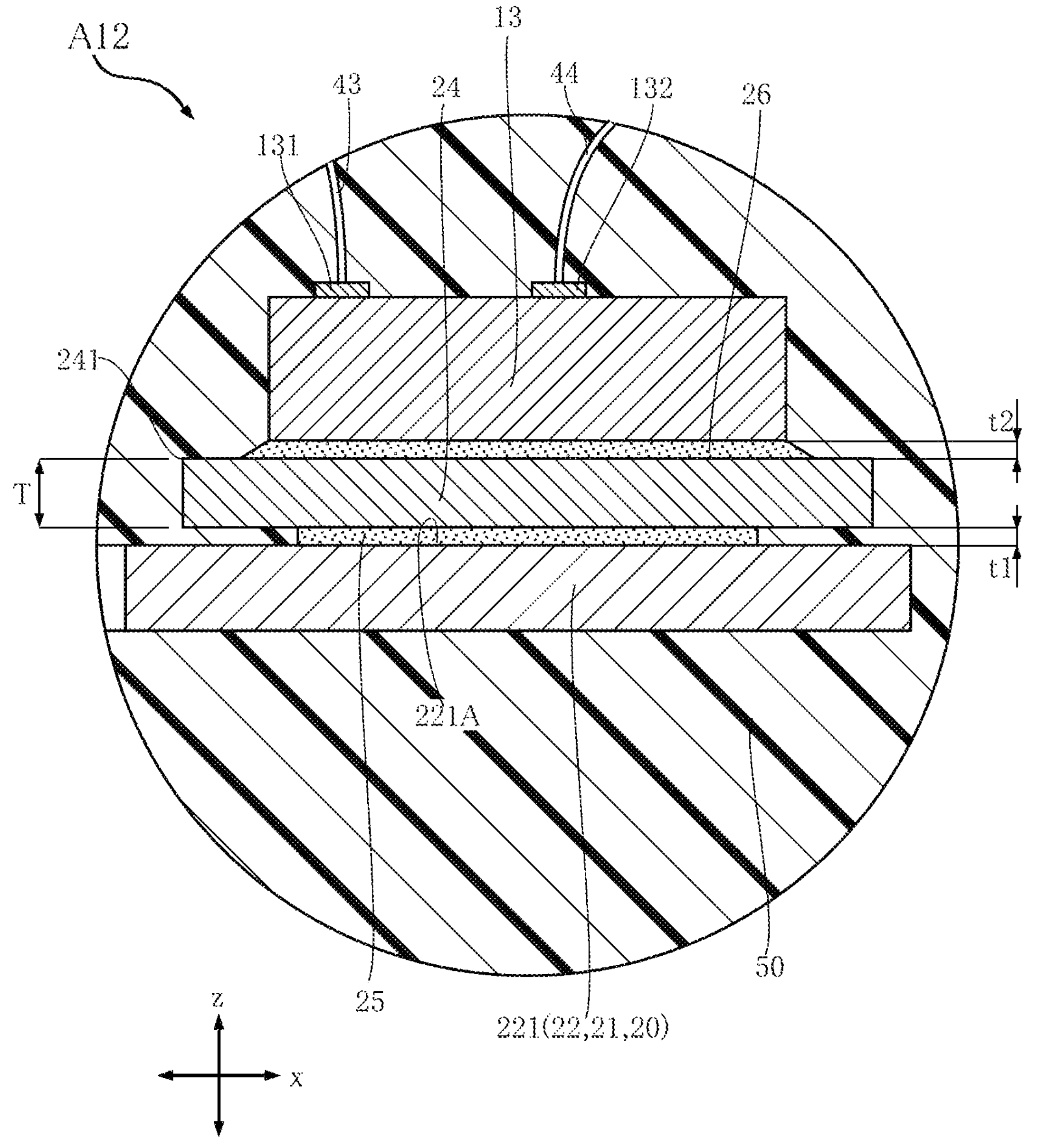
FIG. 14 is a sectional view taken along line XIV-XIV in FIG. 13.

As shown in FIGS. 13 and 14, in the semiconductor device A12, the first bonding layer 25 is located inward from the periphery 241 of the insulating substrate 24 as viewed in the thickness direction z. As shown in FIG. 13, the area of the first bonding layer 25 is smaller than the area of the second bonding layer 26 as viewed in the thickness direction z.

Next, the effect and advantages of the semiconductor device A1 will be described.

The semiconductor device A1 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A1 further includes the insulating substrate 24 interposed between the die pad 21 and the insulating element 13 and bonded to the die pad 21. The insulating element 13 is bonded to the insulating substrate 24. Dielectric breakdown of the insulating element 13 occurs when charged carriers move from the die pad 21 to the insulating element 13. According to the present configuration, the insulating substrate 24 hinders movement of such carriers from the upper surface of the die pad 21 (the first mounting surface 221A of the first pad portion 221 of the first die pad 22) to the lower surface of the insulating element 13 that faces the upper surface. This makes dielectric breakdown of the insulating element 13 less likely to occur. Thus, the semiconductor device A1 is capable of increasing the dielectric strength between the die pad 21, on which the semiconductor elements (the first semiconductor element 11 and the second semiconductor element 12) are mounted, and the insulating element 13.

The semiconductor device A1 also includes the first bonding layer 25 interposed between the die pad 21 and the insulating substrate 24 and the second bonding layer 26 interposed between the insulating substrate 24 and the insulating element 13. Preferably, the first bonding layer 25 and the second bonding layer 26 have an electrically insulating property. This effectively hinders movement of charged carriers from the upper surface of the die pad 21 to the lower surface of the insulating element 13.

In the semiconductor device A11, the first bonding layer 25 is located inward from the periphery 241 of the insulating substrate 24 as viewed in the thickness direction z. Charged carriers move along the interface between the first bonding layer 25 and the sealing resin 50, the interface between the second bonding layer 26 and the sealing resin 50, and the interface between the insulating substrate 24 and the sealing resin 50. The present configuration increases the travel distance of such carriers from the upper surface of the die pad 21 to the lower surface of the insulating element 13, thereby effectively improving the dielectric strength between the die pad 21 and the insulating element 13. In the semiconductor device A12, the area of the first bonding layer is smaller than the area of the second bonding layer 26 as viewed in the thickness direction z. This configuration further increases the travel distance of the above-mentioned carriers, which leads to more effective improvement of the dielectric strength between the die pad 21 and the insulating element 13.

The insulating element 13 has the first transmitter/receiver 133, the second transmitter/receiver 134, and the relay unit 135. In the thickness direction z, the relay unit 135 is located closer to the insulating substrate 24 than are the first transmitter/receiver 133 and the second transmitter/receiver 134. Such a configuration enables the potential difference between the first transmitter/receiver 133 and the relay unit 135 and the potential difference between the second transmitter/receiver 134 and the relay unit 135 to be set small in the insulating element 13. This allows improvement of the dielectric strength of the insulating element 13. Moreover, the potential difference between the upper surface of the die pad 21 and the lower surface of the insulating element 13 is reduced. This leads to more effective improvement of the dielectric strength between the die pad 21 and the insulating element 13.

The insulating substrate 24 is located inward from the periphery of the die pad 21 as viewed in the thickness direction z. This prevents an increase in size of the semiconductor device A1.

In the semiconductor device A1, each conductive member is partially exposed at either one of the pair of first side surfaces 53 of the sealing resin 50. Such a configuration is realized by exposing the two first suspension lead portions 222 of the first die pad 22 at one side of the sealing resin 50 in the first direction x and exposing the two second suspension lead portions 232 of the second die pad 23 at the other side of the sealing resin 50 in the first direction x. With such a configuration, the conductive members 20 are spaced apart from the pair of second side surfaces 54 of the sealing resin 50. Thus, in the semiconductor device A1, metal parts for supporting the die pad 21 on a frame are not exposed at the second side surfaces 54 during the manufacture of the semiconductor device A1. This allows improvement of the dielectric strength of the semiconductor device A1.

In the semiconductor device A1, the first pad portion 221 of the first die pad 22, which is larger in area than the second pad portion 231 of the second die pad 23, is formed with the through-holes 223. During the manufacture of the semiconductor device A1, the fluidized sealing resin 50 passes through these through-holes 223, which prevents poor filling of the sealing resin 50. Thus, generation of voids in the sealing resin 50 is effectively prevented. This prevents a decrease of the dielectric strength of the semiconductor device A1.

Figure 15:
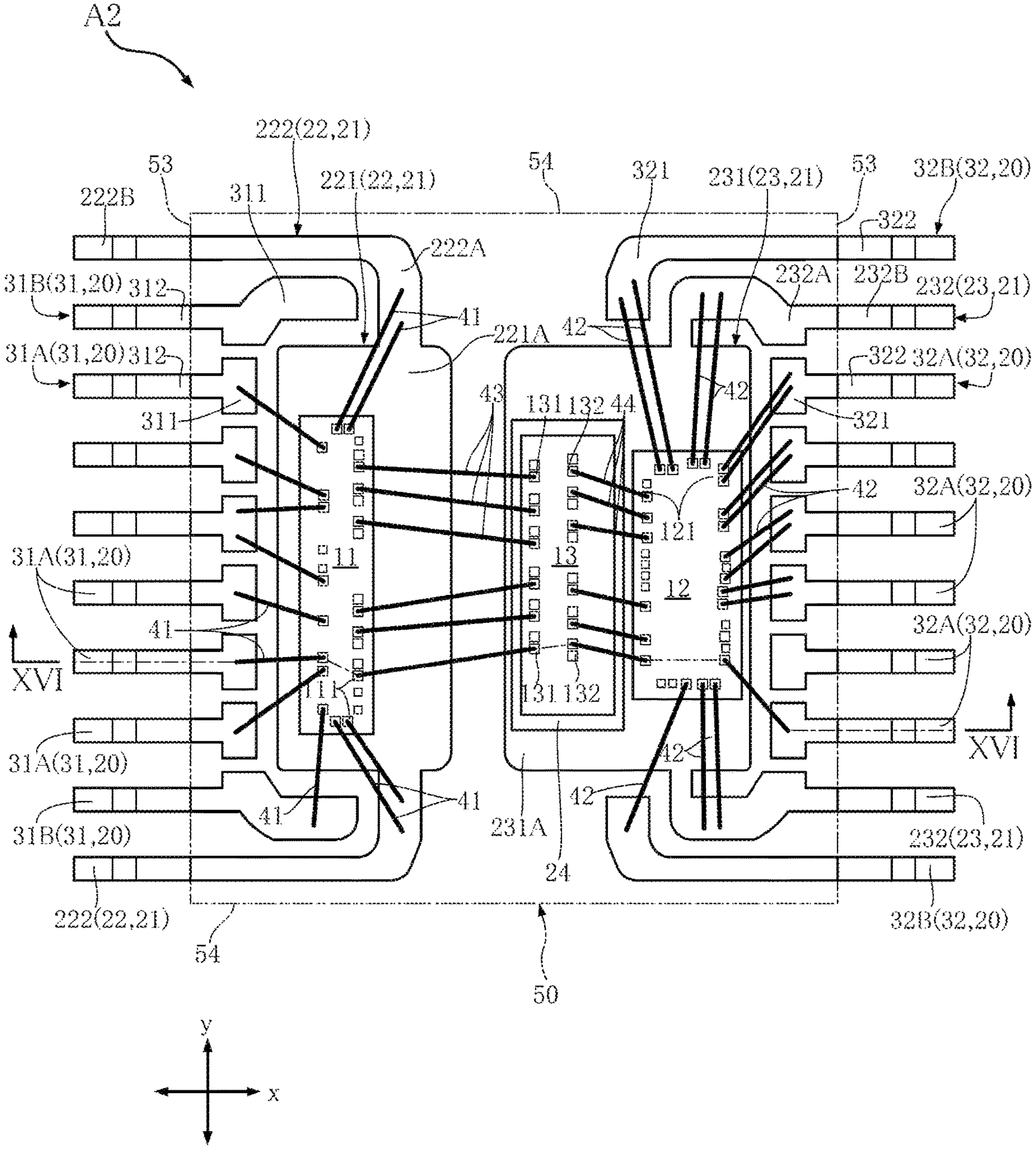
FIG. 15 is a plan view of a semiconductor device according to a second embodiment of the present disclosure, as seen through a sealing resin.

A semiconductor device A2 according to a second embodiment of the present disclosure is described below with reference to FIGS. 15 and 16. In these figures, the elements that are identical or similar to those of the semiconductor device A1 described above are denoted by the same reference signs, and the descriptions thereof are omitted. For convenience of understanding, the sealing resin 50 is transparent in FIG. 15. In FIG. 15, the outlines of the sealing resin 50 is shown by imaginary lines.

The semiconductor device A2 differs from the semiconductor device A1 in configurations of the insulating element 13 and the insulating substrate 24.

Figure 16:
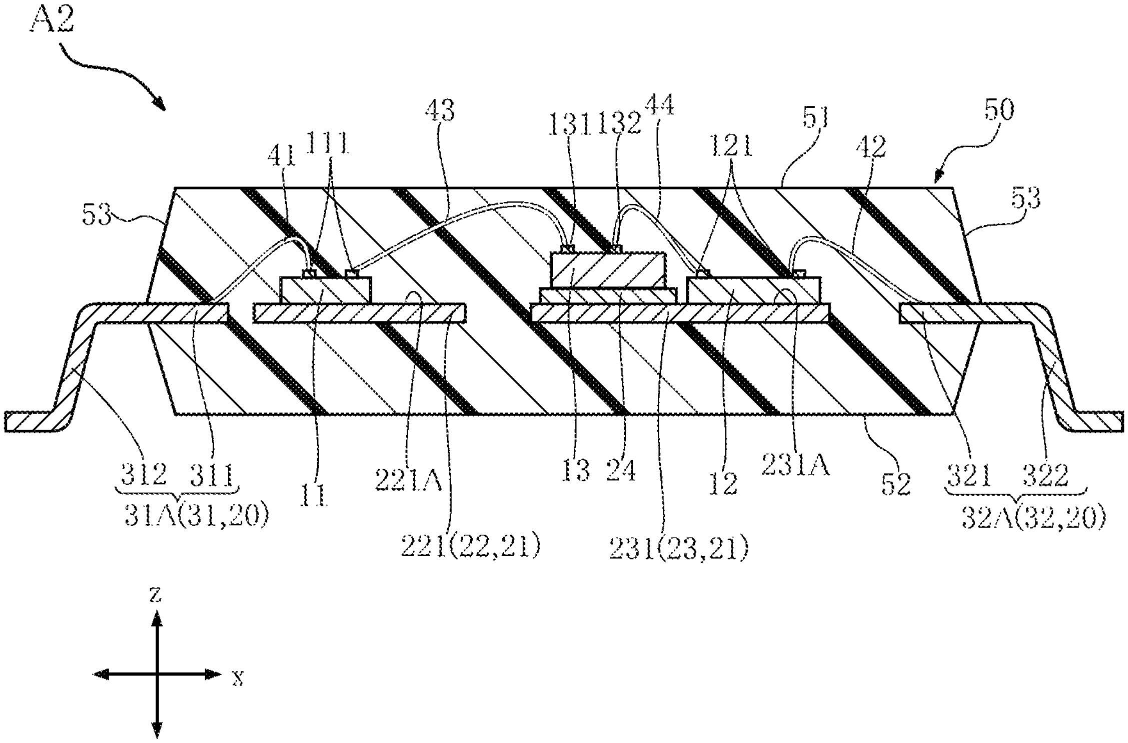
FIG. 16 is a sectional view taken along line XVI-XVI in FIG. 15.

As shown in FIGS. 15 and 16, the insulating substrate 24 is bonded to the second mounting surface 231A of the second pad portion 231 of the second die pad 23. Thus, the insulating element 13 is located on the second pad portion 231 together with the second semiconductor element 12. As with the semiconductor device A1, the insulating substrate 24 is mounted on the second mounting surface 231A via the first bonding layer 25 (see FIG. 9). Also, as with the semiconductor device A1, the insulating element 13 is bonded to the insulating substrate 24 via the second bonding layer 26. In the semiconductor device A2, therefore, the third wires 43 extend across the gap between the first pad portion 221 of the first die pad 22 and the second pad portion 231. In this way, even in the case where the potential of the second pad portion 231 is higher than the potential of the first pad portion 221, the insulating element 13 can be mounted on the second pad portion 231.

Next, the effect and advantages of the semiconductor device A2 will be described.

The semiconductor device A2 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A2 further includes the insulating substrate 24 interposed between the die pad 21 and the insulating element 13 and bonded to the die pad 21. The insulating element 13 is bonded to the insulating substrate 24. Thus, the semiconductor device A2 is also capable of improving the dielectric strength between the die pad 21, on which the semiconductor elements (the first semiconductor element 11 and the second semiconductor element 12) are mounted, and the insulating element 13. The semiconductor device A2 has a configuration in common with the semiconductor device A1, thereby achieving the same effect as the semiconductor device A1.

Figure 17:
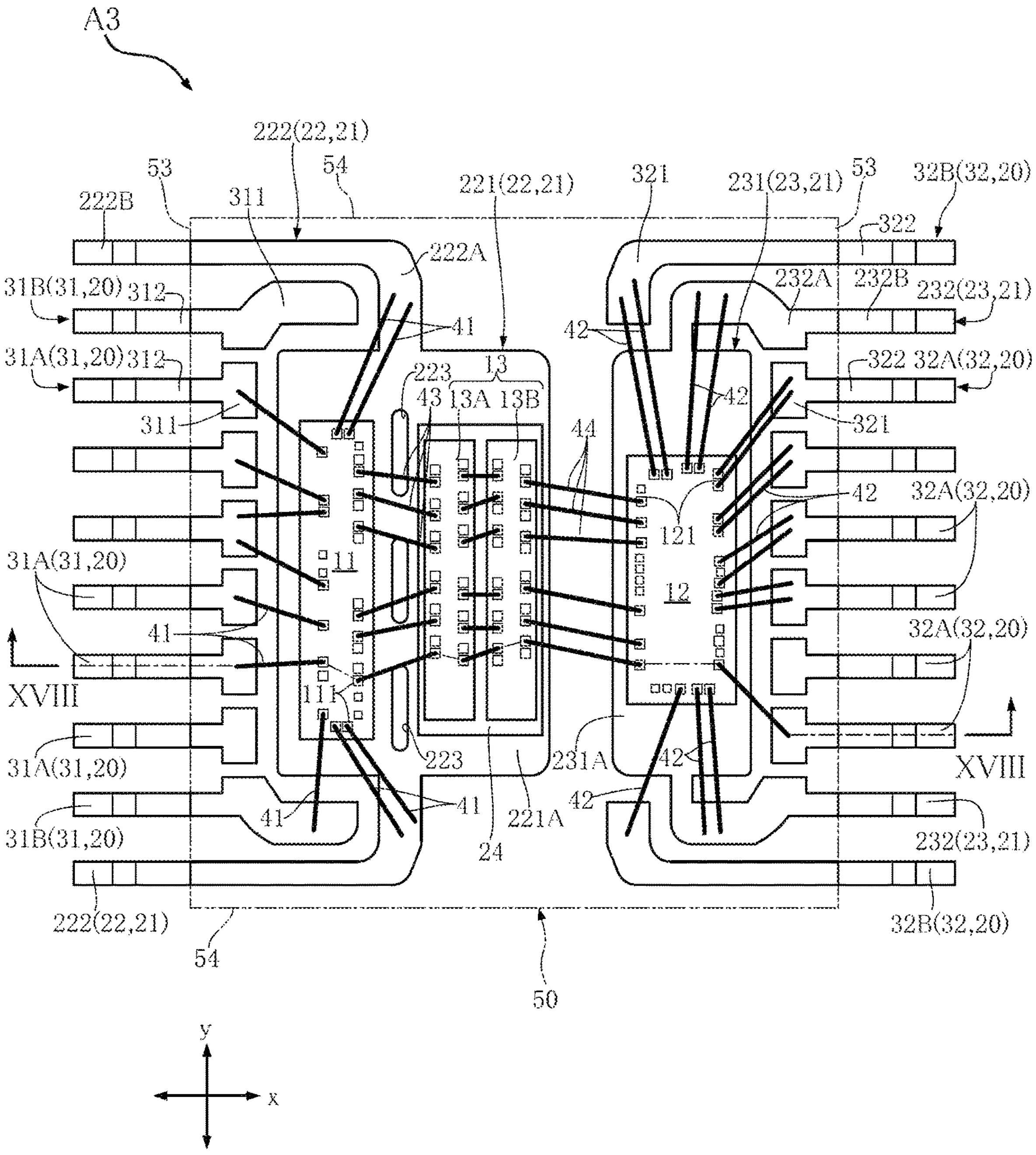
FIG. 17 is a plan view of a semiconductor device according to a third embodiment of the present disclosure, as seen through a sealing resin.
Figure 18:
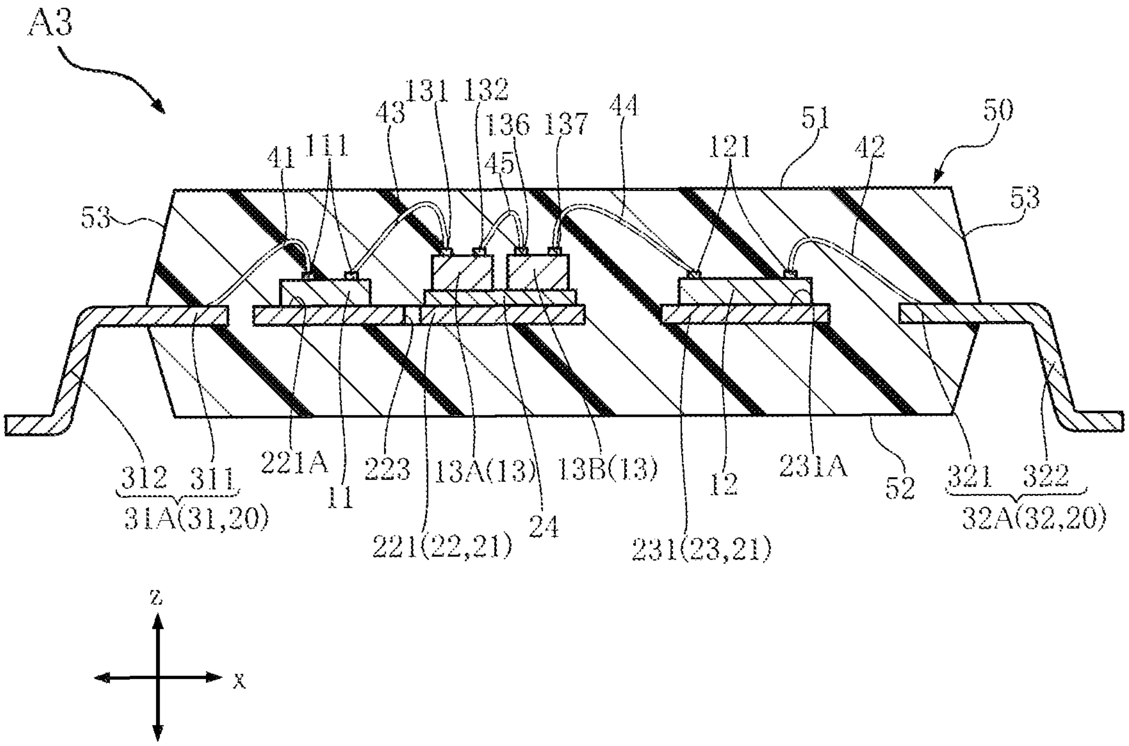
FIG. 18 is a sectional view taken along line XVIII-XVIII in FIG. 17.

A semiconductor device A3 according to a third embodiment of the present disclosure is described below with reference to FIGS. 17 to 21. In these figures, the elements that are identical or similar to those of the semiconductor device A1 described above are denoted by the same reference signs, and the descriptions thereof are omitted. For convenience of understanding, the sealing resin 50 is transparent in FIG. 17. In FIG. 17, the outlines of the sealing resin 50 is shown by imaginary lines.

The semiconductor device A3 differs from the semiconductor device A1 in configuration of the insulating element 13. The semiconductor device A3 further includes a plurality of fifth wires 45.

Figure 19:
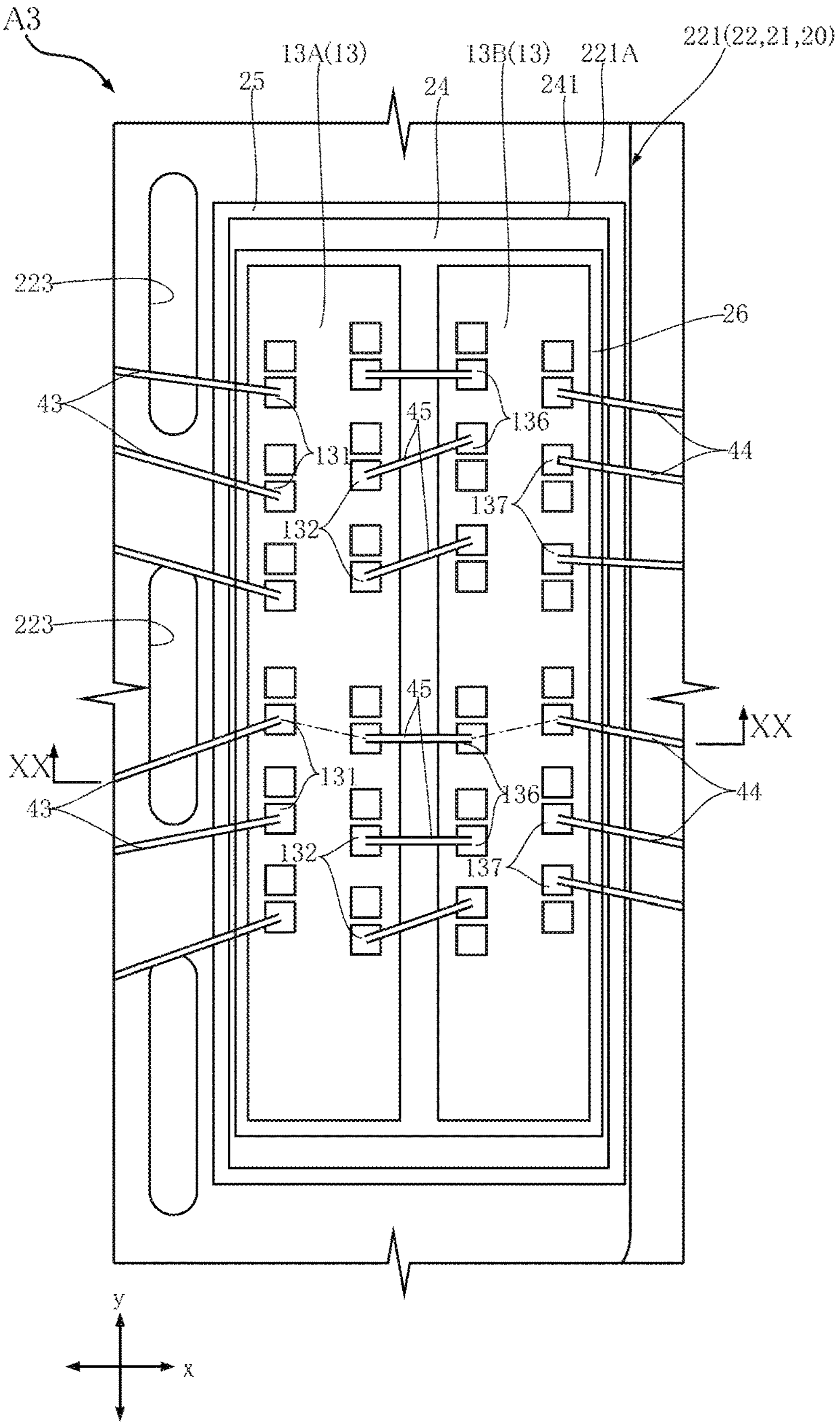
FIG. 19 is a partially enlarged view in which a portion of FIG. 17 is enlarged.
Figure 20:
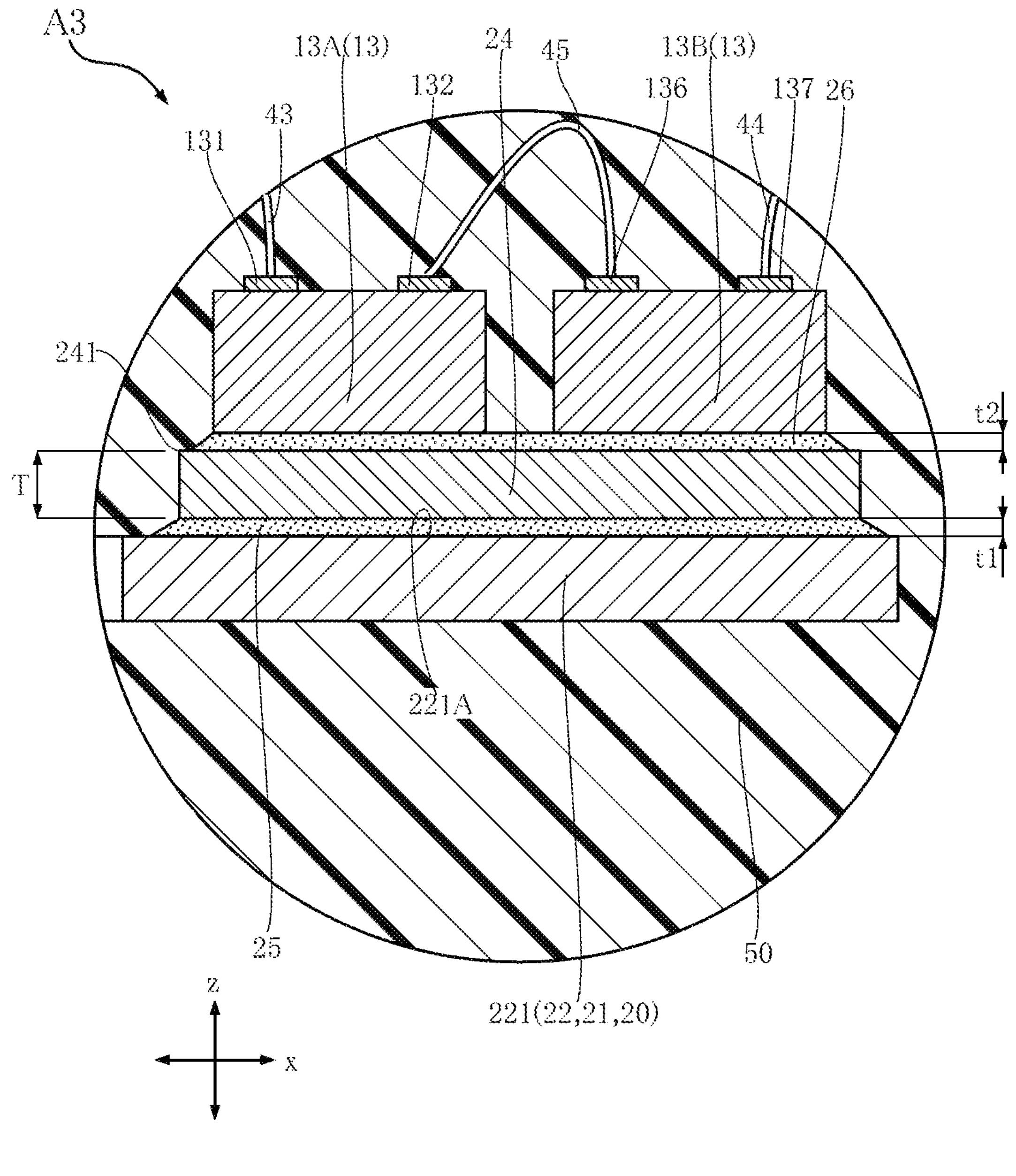
FIG. 20 is a sectional view taken along line XX-XX in FIG. 19.

As shown in FIGS. 17 to 20, the insulating element 13 includes a first insulating element 13A and a second insulating element 13B that are spaced apart from each other. In the semiconductor device A3, the first insulating element 13A and the second insulating element 13B are spaced apart from each other in the first direction x such that the first insulating element 13A is closer to the first semiconductor element 11 than is the second insulating element 13B. The first insulating element 13A and the second insulating element 13B are bonded to the insulating substrate 24 via the second bonding layer 26. As shown in FIGS. 19 and 20, in the semiconductor device A3, the second bonding layer 26 is a single layer. Alternatively, the second bonding layer 26 may be made up of separate portions, as with the first insulating element 13A and the second insulating element 13B. In the semiconductor device A3, the insulating substrate 24 is bonded to the first mounting surface 221A of the first pad portion 221 of the first die pad 22 via the first bonding layer 25. Alternatively, as with the semiconductor device A2, the insulating substrate 24 may be bonded to the second mounting surface 231A of the second pad portion 231 of the second die pad 23.

As shown in FIG. 19, the first insulating element 13A has a plurality of first relay electrodes 131 and a plurality of second relay electrodes 132. The third wires 43 are bonded to the first relay electrodes 131 and the first electrodes 111 of the first semiconductor element 11. Thus, the first relay electrodes 131 electrically conduct to the first semiconductor element 11.

Figure 21:
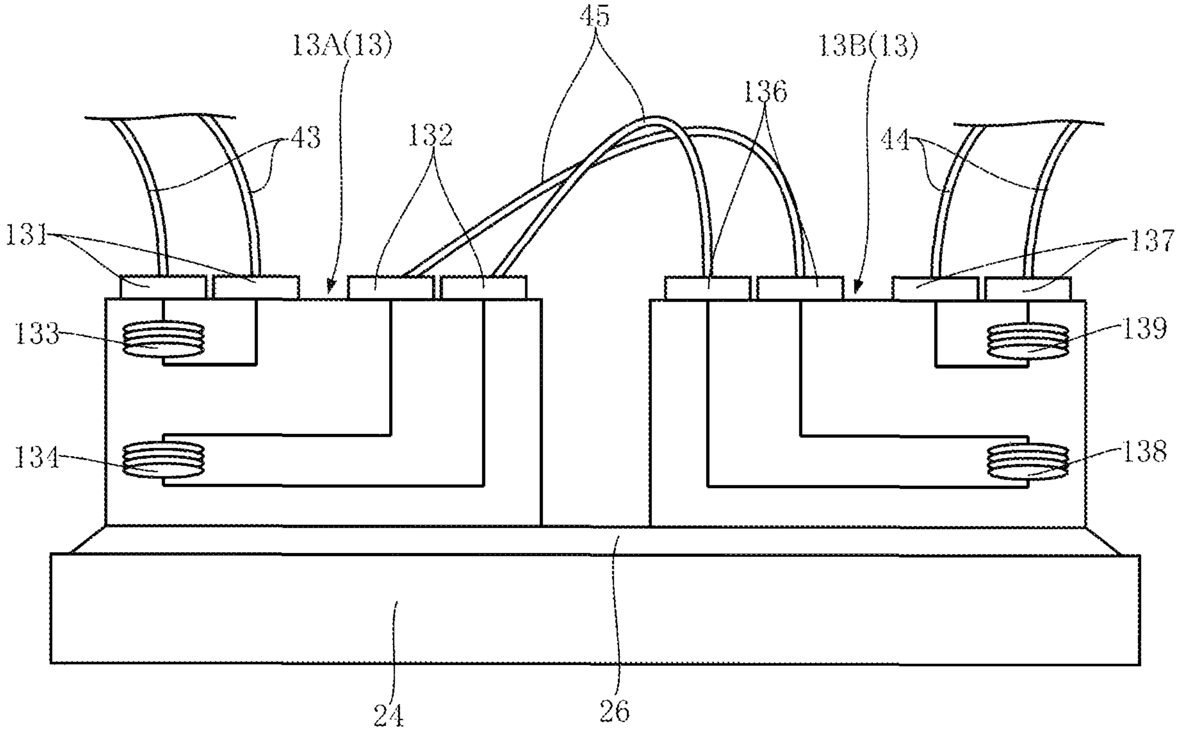
FIG. 21 is a schematic view of the insulating element and the insulating substrate shown in FIG. 20.

As shown in FIG. 21, the first insulating element 13A has a first transmitter/receiver 133 and a second transmitter/receiver 134. In the semiconductor device A3, the first transmitter/receiver 133 and the second transmitter/receiver 134 are inductors. The first transmitter/receiver 133 and the second transmitter/receiver 134 are spaced apart from each other in the thickness direction z. In the first insulating element 13A, a dielectric layer (not shown) made of e.g. silicon dioxide is interposed between the first transmitter/receiver 133 and the second transmitter/receiver 134. The first transmitter/receiver 133 electrically conducts to the first relay electrodes 131. Thus, the first transmitter/receiver 133 electrically conducts to the first semiconductor element 11. The second transmitter/receiver 134 transmits/receives signals to/from the first transmitter/receiver 133. The second transmitter/receiver 134 electrically conducts to the second relay electrodes 132. In the thickness direction z, the second transmitter/receiver 134 is located closer to the insulating substrate 24 than is the first transmitter/receiver 133.

As shown in FIG. 19, the second insulating element 13B has a plurality of third relay electrodes 136 and a plurality of fourth relay electrodes 137. The fourth wires 44 are bonded to the fourth relay electrodes 137 and the second electrodes 121 of the second semiconductor element 12. Thus, the fourth relay electrodes 137 electrically conduct to the second semiconductor element 12.

As shown in FIG. 21, the second insulating element 13B has a third transmitter/receiver 138 and a fourth transmitter/receiver 139. In the semiconductor device A3, the third transmitter/receiver 138 and the fourth transmitter/receiver 139 are inductors. The third transmitter/receiver 138 and the fourth transmitter/receiver 139 are spaced apart from each other in the thickness direction z. In the second insulating element 13B, a dielectric layer (not shown) made of e.g. silicon dioxide is interposed between the third transmitter/receiver 138 and the fourth transmitter/receiver 139. The fourth transmitter/receiver 139 electrically conducts to the fourth relay electrodes 137. Thus, the fourth transmitter/receiver 139 electrically conducts to the second semiconductor element 12. The third transmitter/receiver 138 transmits/receives signals to/from the fourth transmitter/receiver 139. The third transmitter/receiver 138 electrically conducts to the third relay electrodes 136. In the thickness direction z, the third transmitter/receiver 138 is located closer to the insulating substrate 24 than is the fourth transmitter/receiver 139.

As shown in FIGS. 19 and 20, the fifth wires 45 are bonded to the third relay electrodes 136 of the second insulating element 13B and the second relay electrodes 132 of the first insulating element 13A. Each of the fifth wires 45 contains gold. In this way, the second relay electrodes 132 and the third relay electrodes 136 electrically conduct to each other. Thus, the third transmitter/receiver 138 of the second insulating element 13B electrically conducts to the second transmitter/receiver 134 of the first insulating element 13A. Therefore, the potential of the third transmitter/receiver 138 is equal to the potential of the second transmitter/receiver 134. Thus, the potential of the second transmitter/receiver 134 and the third transmitter/receiver 138 takes a value between the potential of the first transmitter/receiver 133 of the first insulating element 13A and the potential of the fourth transmitter/receiver 139 of the second insulating element 13B.

Next, the effect and advantages of the semiconductor device A3 will be described.

The semiconductor device A3 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A3 further includes the insulating substrate 24 interposed between the die pad 21 and the insulating element 13 and bonded to the die pad 21. The insulating element 13 is bonded to the insulating substrate 24. The insulating substrate 24 is interposed between the die pad 21 and the insulating element 13. Thus, the semiconductor device A3 is also capable of improving the dielectric strength between the die pad 21, on which the semiconductor elements (the first semiconductor element 11 and the second semiconductor element 12) are mounted, and the insulating element 13. The semiconductor device A3 has a configuration in common with the semiconductor device A1, thereby achieving the same effect as the semiconductor device A1.

The insulating element 13 of the semiconductor device A3 includes the first insulating element 13A and the second insulating element 13B that are spaced apart from each other. The first insulating element 13A has the first transmitter/receiver 133 and the second transmitter/receiver 134. The second insulating element 13B has the third transmitter/receiver 138 and the fourth transmitter/receiver 139. The third transmitter/receiver 138 electrically conducts to the second transmitter/receiver 134. In the thickness direction z, the second transmitter/receiver 134 and the third transmitter/receiver 138 are located closer to the insulating substrate 24 than are the first transmitter/receiver 133 and the fourth transmitter/receiver 139. Such a configuration enables the potential difference between the first transmitter/receiver 133 and the second transmitter/receiver 134 to be set small in the first insulating element 13A. Also, the potential difference between the third transmitter/receiver 138 and the fourth transmitter/receiver 139 can be set small in the second insulating element 13B. That is, the potential difference generated in each of the first insulating element 13A and the second insulating element 13B is reduced. Moreover, the potential difference between the die pad 21 and the insulating element 13 is also reduced. This leads to more effective improvement of the dielectric strength between the die pad 21 and the insulating element 13. Unlike the semiconductor device A1, the semiconductor device A3 does not need to provide the relay unit 135 in the insulating element 13.

Figure 22:
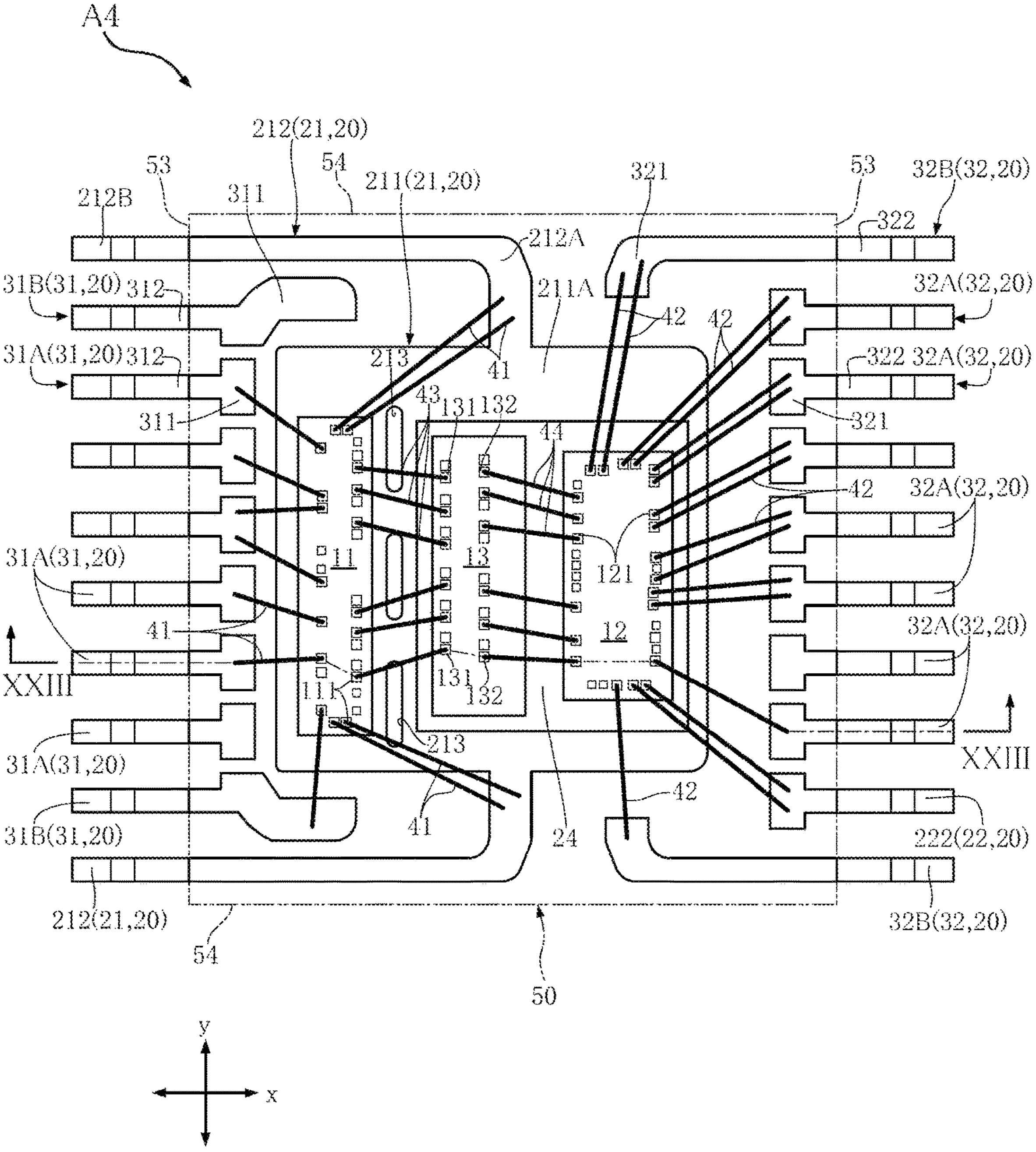
FIG. 22 is a plan view of a semiconductor device according to a fourth embodiment of the present disclosure, as seen through a sealing resin.

A semiconductor device A4 according to a fourth embodiment of the present disclosure is described below with reference to FIGS. 22 to 24. In these figures, the elements that are identical or similar to those of the semiconductor device A1 described above are denoted by the same reference signs, and the descriptions thereof are omitted. For convenience of understanding, the sealing resin 50 is transparent in FIG. 22. In FIG. 22, the outlines of the sealing resin 50 is shown by imaginary lines.

The semiconductor device A4 differs from the semiconductor device A1 in configurations of the second semiconductor element 12 and the die pad 21.

Figure 23:
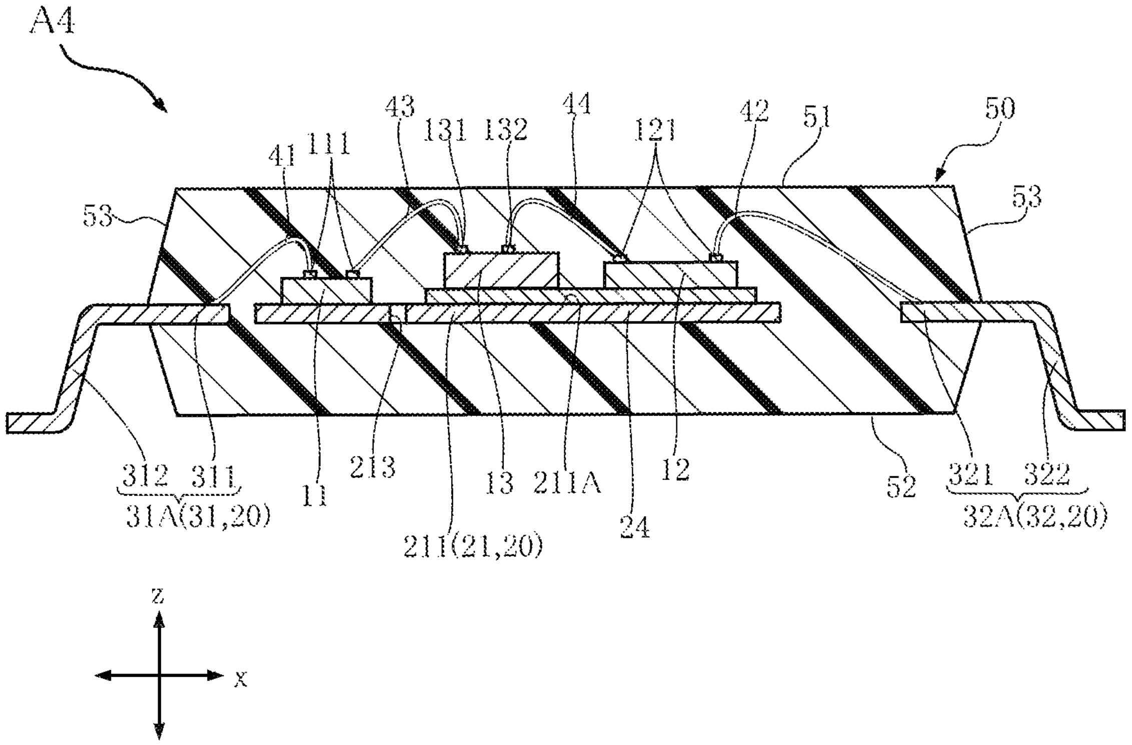
FIG. 23 is a sectional view taken along line XXIII-XXIII in FIG. 22.

As shown in FIGS. 22 and 23, the die pad 21 is a single member, which does not include the first die pad 22 and the second die pad 23. The die pad 21 includes a pad portion 211 and two suspension lead portions 212. The first semiconductor element 11 and the second semiconductor element 12 are located on the pad portion 211. The pad portion 211 has a mounting surface 211A facing in the thickness direction z. The first semiconductor element 11 is bonded to the mounting surface 211A via a conductive bonding material (such as solder or metal paste) not shown. As shown in FIG. 24, the insulating substrate 24 is bonded to the mounting surface 211A via a first bonding layer 25. The pad portion 211 is covered with the sealing resin 50. The thickness of the pad portion 211 is equal to or greater than 150 μm and equal to or less than 200 μm, for example.

As shown in FIGS. 22 and 23, the pad portion 211 is formed with a plurality of through-holes 213. Each of the through-holes 213 penetrates the pad portion 211 in the thickness direction z and extends along the second direction y. As viewed in the thickness direction z, at least one of the through-holes 213 is located between the first semiconductor element 11 and the insulating substrate 24. The through-holes 213 are arranged along the second direction y.

As shown in FIG. 22, the two suspension lead portions 212 are connected to opposite ends in the second direction y of the pad portion 211. The two suspension lead portions 212 each have a covered portion 212A and an exposed portion 212B. The covered portion 212A is connected to the pad portion 211 and covered with the sealing resin 50. The covered portion 212A includes a section extending in the first direction x. The exposed portion 212B is connected to the covered portion 212A and exposed from the one of the paired first side surfaces 53 of the sealing resin 50 from which the exposed portions 312 of the first terminals 31 are exposed. The exposed portion 212B extends along the first direction x as viewed in the thickness direction z. The exposed portion 212B is bent into a gull-wing profile as viewed in the second direction y. The surface of the exposed portion 222B may be plated with tin, for example.

As shown in FIG. 22, at least one of the first wires 41 is bonded to one of the first electrodes 111 of the first semiconductor element 11 and one of the covered portions 212A of the two suspension lead portions 212. With such a configuration, at least one of the two suspension lead portions 212 provides a ground terminal that electrically conducts to the first semiconductor element 11.

Figure 24:
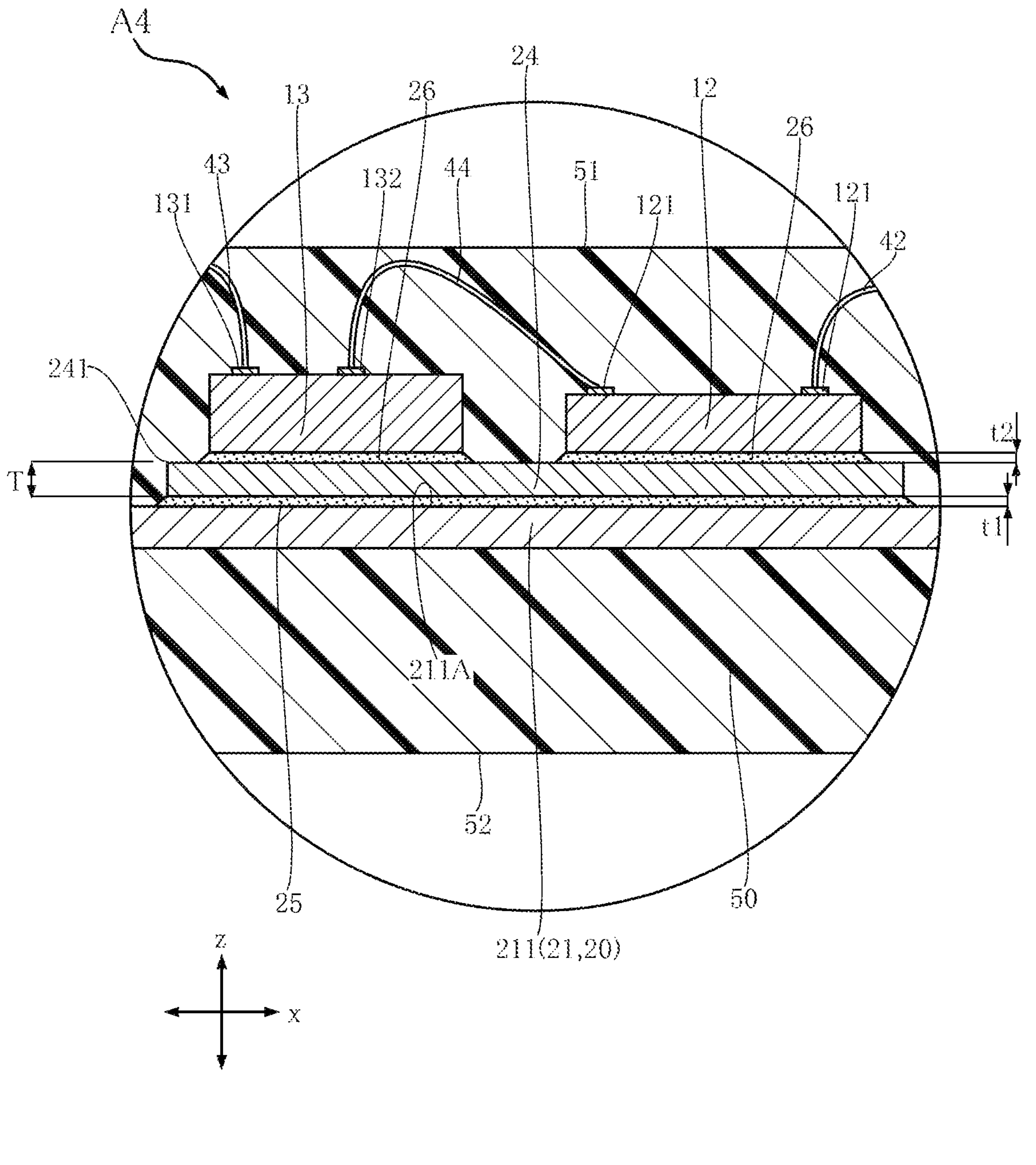
FIG. 24 is a partially enlarged view in which a portion of FIG. 23 is enlarged.

As shown in FIGS. 22 to 24, the second semiconductor element 12 is bonded to the insulating substrate 24 via the second bonding layer 26. Thus, in the semiconductor device A4, the insulating substrate 24 is interposed between the die pad 21 and the second semiconductor element 12 or the insulating element 13, and the second semiconductor element 12 and the insulating element 13 are bonded to the insulating substrate 24. The area of the insulating substrate 24 is larger than the area of the insulating substrate 24 of the semiconductor device A1. As viewed in the thickness direction z, the fourth wires 44 are located inward from the periphery 241 of the insulating substrate 24.

As shown in FIG. 22, at least one of the second wires 42 is bonded to one of the second electrodes 121 of the second semiconductor element 12 and one of the covered portions 321 of the two second-side terminals 32B (the second terminals 32). With such a configuration, at least one of the two second-side terminals 32B provides a ground terminal that electrically conducts to the second semiconductor element 12.

Next, the effect and advantages of the semiconductor device A4 will be described.

The semiconductor device A4 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A4 further includes the insulating substrate 24 interposed between the die pad 21 and the insulating element 13 and bonded to the die pad 21. The insulating element 13 is bonded to the insulating substrate 24. Thus, the semiconductor device A4 is also capable of improving the dielectric strength between the die pad 21, on which the semiconductor elements (the first semiconductor element 11 and the second semiconductor element 12) are mounted, and the insulating element 13. The semiconductor device A4 has a configuration in common with the semiconductor device A1, thereby achieving the same effect as the semiconductor device A1.

In the semiconductor device A4, the first semiconductor element 11 is bonded to the pad portion 211 of the die pad 21, and the second semiconductor element 12 is bonded to the insulating substrate 24. Such a configuration allows the first semiconductor element 11 and the second semiconductor element 12 to be insulated from each other by the insulating element 13 and the insulating substrate 24. Moreover, since the die pad 21 is a single member, the shape of the die pad 21 can be simplified.

Figure 25:
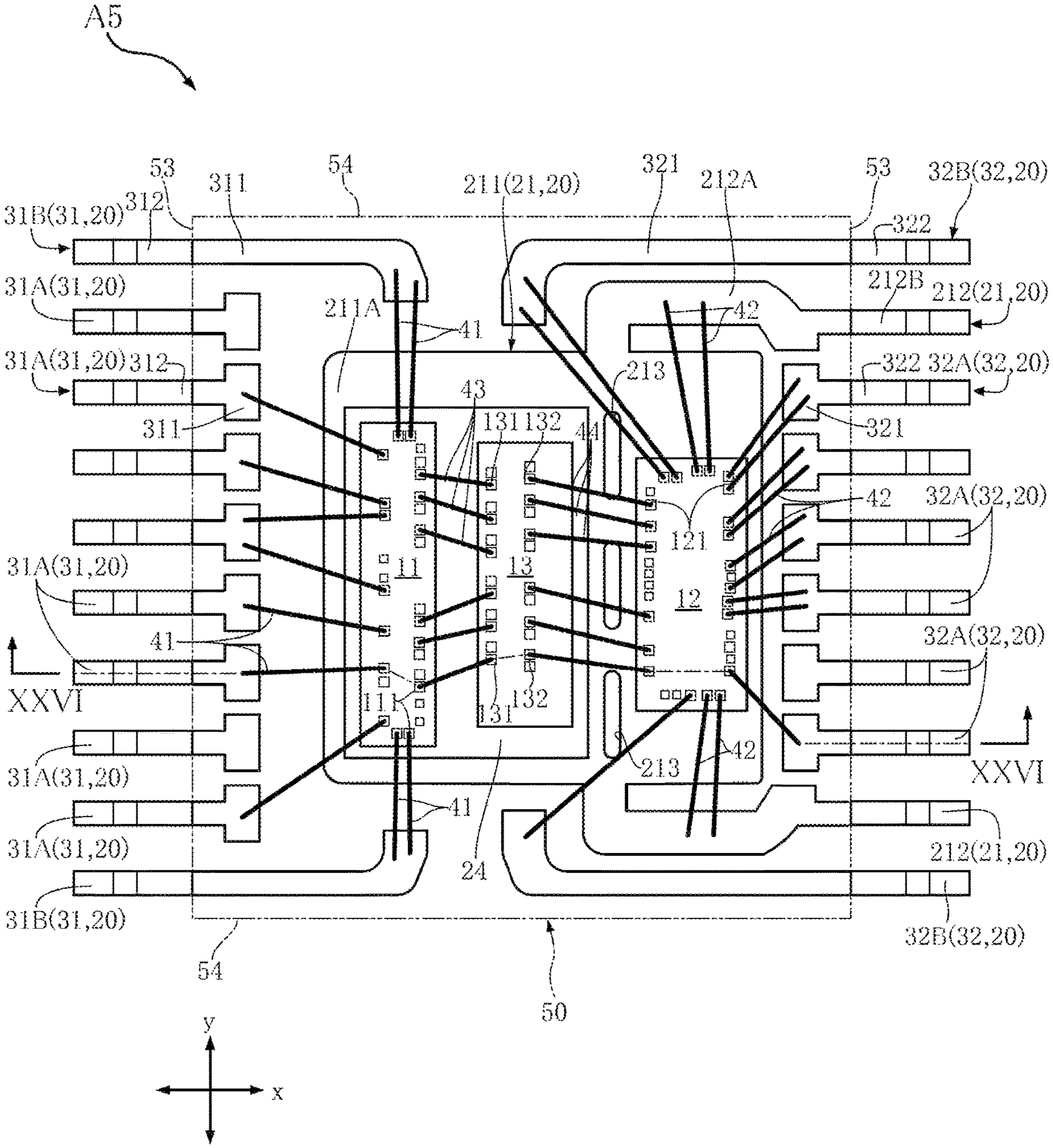
FIG. 25 is a plan view of a semiconductor device according to a fifth embodiment of the present disclosure, as seen through a sealing resin.

A semiconductor device A5 according to a fifth embodiment of the present disclosure is described below with reference to FIGS. 25 and 26. In these figures, the elements that are identical or similar to those of the semiconductor device A1 described above are denoted by the same reference signs, and the descriptions thereof are omitted. For convenience of understanding, the sealing resin 50 is transparent in FIG. 25. In FIG. 25, the outlines of the sealing resin 50 is shown by imaginary lines.

The semiconductor device A5 differs from the semiconductor device A1 in configurations of the first semiconductor element 11 and the die pad 21.

Figure 26:
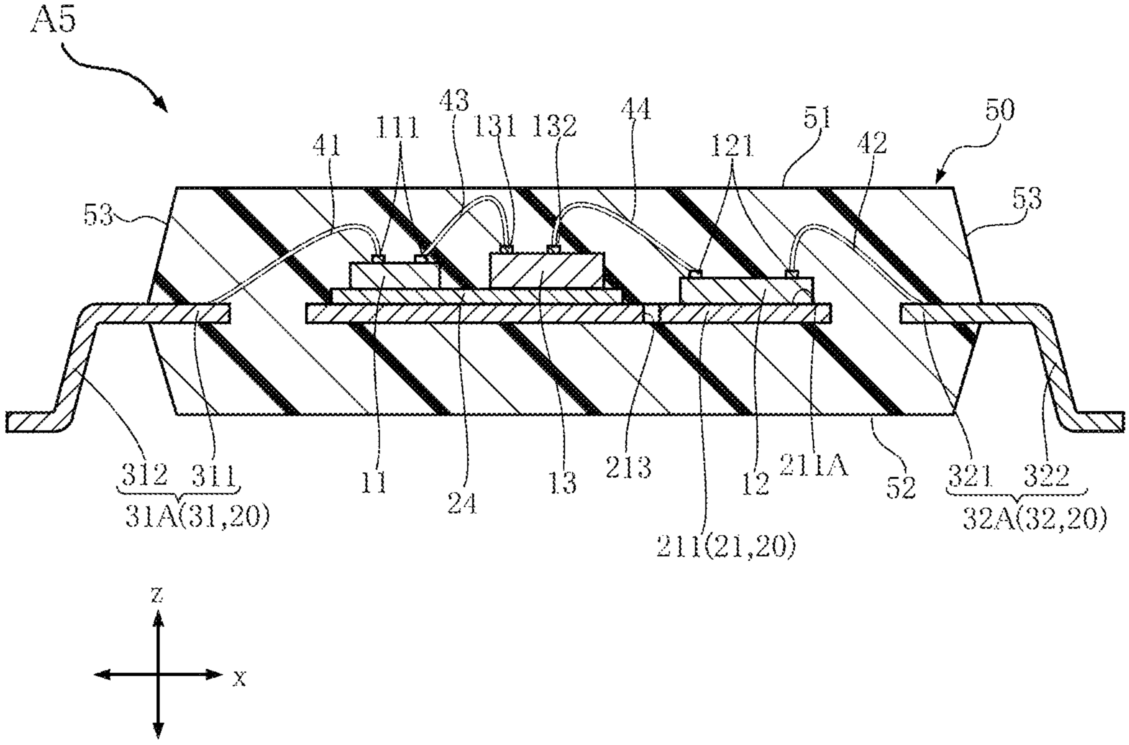
FIG. 26 is a sectional view taken along line XXVI-XXVI in FIG. 25.

As shown in FIGS. 25 and 26, the die pad 21 is a single member that does not include the first die pad 22 and the second die pad 23, as with the semiconductor device A4. The die pad 21 includes a pad portion 211 and two suspension lead portions 212. The second semiconductor element 12 is bonded to the mounting surface 211A of the pad portion 211 via a conductive bonding material (such as solder or metal paste) not shown. As viewed in the thickness direction z, at least one of the through-holes 213 is located between the insulating substrate 24 and the second semiconductor element 12.

As shown in FIG. 25, the exposed portions 212B of the two suspension lead portions 212 are exposed from one of the paired first side surfaces 53 of the sealing resin 50 from which the exposed portions 322 of the second terminals 32 are exposed.

As shown in FIG. 25, at least one of the first wires 41 is bonded to one of the first electrodes 111 of the first semiconductor element 11 and one of the covered portions 311 of the two first-side terminals 31B (the first terminals 31). With such a configuration, at least one of the two first-side terminals 31B provides a ground terminal that electrically conducts to the first semiconductor element 11.

As shown in FIGS. 25 to 26, the first semiconductor element 11 is bonded to the insulating substrate 24. As with the second semiconductor element 12 of the semiconductor device A4, the first semiconductor element 11 is bonded to the insulating substrate 24 via the second bonding layer 26 (see FIG. 24). Thus, in the semiconductor device A5, the insulating substrate 24 is interposed between the die pad 21 and the first semiconductor element 11 or the insulating element 13, and the first semiconductor element 11 and the insulating element 13 are bonded to the insulating substrate 24. The third wires 43 are located inward from the periphery 241 of the insulating substrate 24 as viewed in the thickness direction z.

As shown in FIG. 22, at least one of the second wires 42 is bonded to one of the second electrodes 121 of the second semiconductor element 12 and one of the covered portions 212A of the two suspension lead portions 212. With such a configuration, at least one of the two suspension lead portions 212 provides a ground terminal that electrically conducts to the second semiconductor element 12.

Next, the effect and advantages of the semiconductor device A5 will be described.

The semiconductor device A5 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A5 further includes the insulating substrate 24 interposed between the die pad 21 and the insulating element 13 and bonded to the die pad 21. The insulating element 13 is bonded to the insulating substrate 24. Thus, the semiconductor device A5 is also capable of improving the dielectric strength between the die pad 21, on which the semiconductor elements (the first semiconductor element 11 and the second semiconductor element 12) are mounted, and the insulating element 13. The semiconductor device A5 has a configuration in common with the semiconductor device A1, thereby achieving the same effect as the semiconductor device A1.

In the semiconductor device A5, the second semiconductor element 12 is bonded to the pad portion 221 of the die pad 21, and the first semiconductor element 11 is bonded to the insulating substrate 24. Such a configuration allows the first semiconductor element 11 and the second semiconductor element 12 to be insulated from each other by the insulating element 13 and the insulating substrate 24. Moreover, since the die pad 21 is a single member, the shape of the die pad 21 can be simplified.

Figure 27:
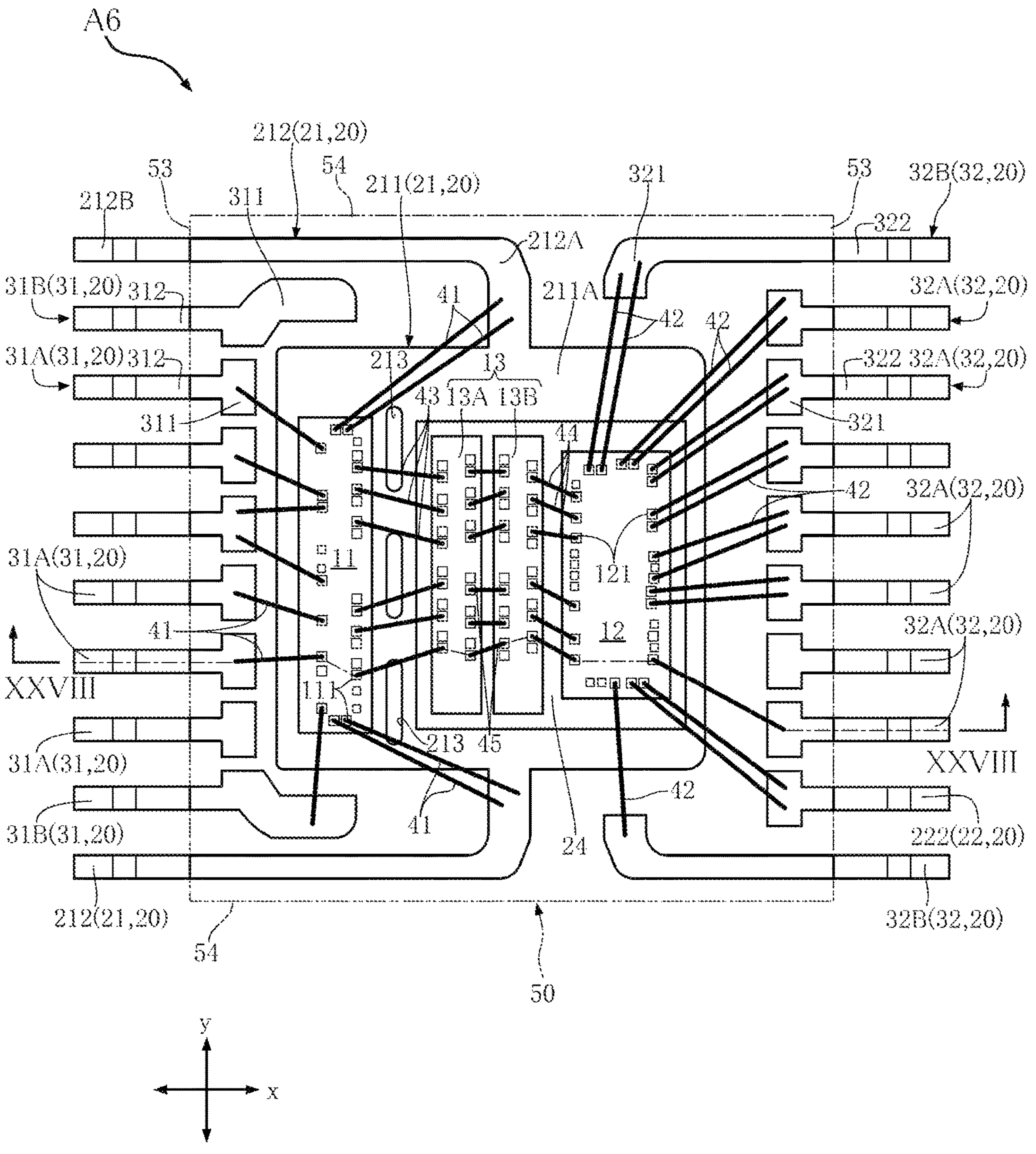
FIG. 27 is a plan view of a semiconductor device according to a sixth embodiment of the present disclosure, as seen through a sealing resin.

A semiconductor device A6 according to a sixth embodiment of the present disclosure is described below with reference to FIGS. 27 and 28. In these figures, the elements that are identical or similar to those of the semiconductor device A1 described above are denoted by the same reference signs, and the descriptions thereof are omitted. For convenience of understanding, the sealing resin 70 is transparent in FIG. 25. In FIG. 27, the outlines of the sealing resin 50 is shown by imaginary lines.

The semiconductor device A6 differs from the semiconductor device A4 in configurations of the insulating element 13. The semiconductor device A6 further includes a plurality of fifth wires 45.

Figure 28:
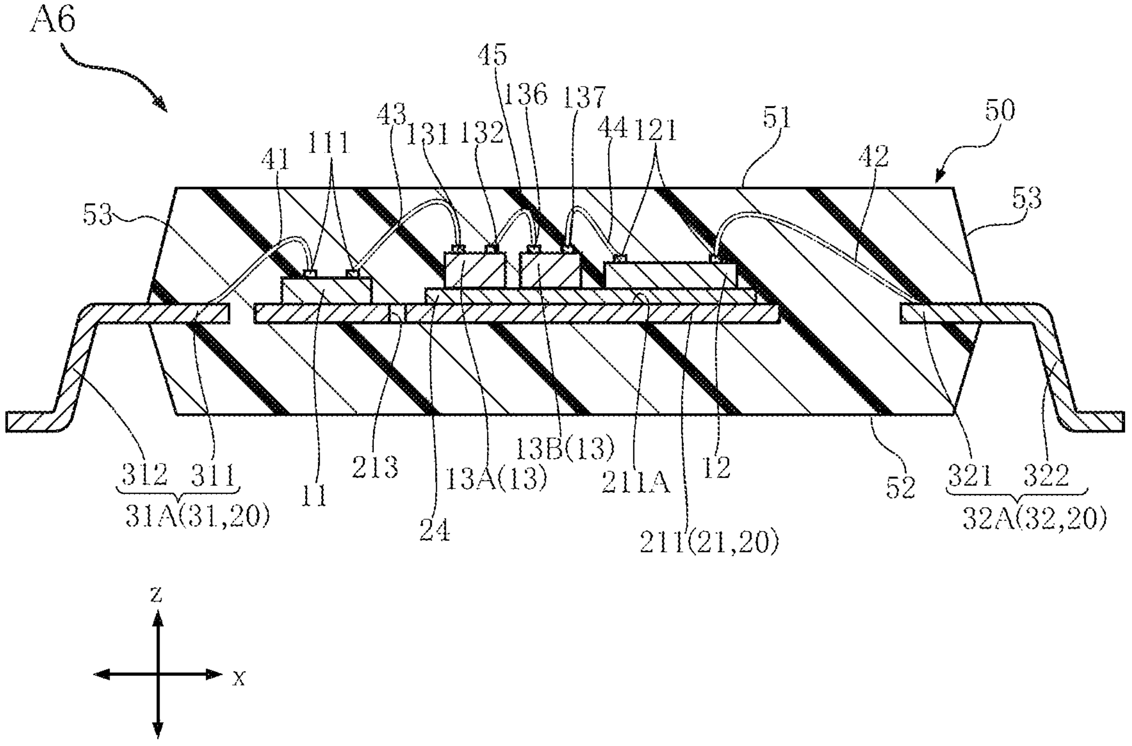
FIG. 28 is a sectional view taken along line XXVIII-XXVIII in FIG. 27.

As shown in FIGS. 27 and 28, the insulating element 13 includes a first insulating element 13A and a second insulating element 13B that are spaced apart from each other. The configurations of the first insulating element 13A, the second insulating element 13B and the fifth wires 45 are the same as those of the semiconductor device A3 described above. Thus, explanations of the first insulating element 13A, the second insulating element 13B and the fifth wires 45 are omitted. In the semiconductor device A6, the first semiconductor element 11 is bonded to the pad portion 211 of the die pad 21, and the second semiconductor element 12, the first insulating element 13A and the second insulating element 13B are bonded to the insulating substrate 24. Alternatively, as with the semiconductor device A5, the second semiconductor element 12 may be bonded to the pad portion 211, and the first semiconductor element 11, the first insulating element 13A and the second insulating element 13B may be bonded to the insulating substrate 24.

Next, the effect and advantages of the semiconductor device A6 will be described.

The semiconductor device A6 includes the conductive members 20 including the die pad 21, the first semiconductor element 11 and the second semiconductor element 12 each located on the die pad 21, and the insulating element 13 that insulates the first semiconductor element 11 and the second semiconductor element 12 from each other. The semiconductor device A6 further includes the insulating substrate 24 interposed between the die pad 21 and the insulating element 13 and bonded to the die pad 21. The insulating element 13 is bonded to the insulating substrate 24. Thus, the semiconductor device A6 is also capable of improving the dielectric strength between the die pad 21, on which the semiconductor elements (the first semiconductor element 11 and the second semiconductor element 12) are mounted, and the insulating element 13. The semiconductor device A6 achieves the same effect as the semiconductor device A3.

The present disclosure is not limited to the foregoing embodiments. The specific configuration of each part of the present disclosure can be varied in design in many ways.

The present disclosure includes the embodiments described in the following clauses.

Clause 1.

A semiconductor device comprising:

a plurality of conductive members including a die pad;

a first semiconductor element and a second semiconductor element each located on the die pad;

an insulating element electrically connected to the first semiconductor element and the second semiconductor element and insulating the first semiconductor element and the second semiconductor element from each other; and an insulating substrate interposed between the die pad and the insulating element and bonded to the die pad, wherein the insulating element is bonded to the insulating substrate.

Clause 2.

The semiconductor device according to clause 1, wherein the die pad includes a first die pad and a second die pad that are spaced apart from each other;

the first semiconductor element is bonded to the first die pad, and the second semiconductor element is bonded to the second die pad.

Clause 3.

The semiconductor device according to clause 2, wherein the insulating substrate is bonded to the first die pad.

Clause 4.

The semiconductor device according to clause 2, wherein the insulating substrate is bonded to the second die pad.

Clause 5.

The semiconductor device according to clause 1, further comprising:

a first bonding layer interposed between the die pad and the insulating substrate; and a second bonding layer interposed between the insulating substrate and the insulating element, wherein a thickness of each of the first bonding layer and the second bonding layer is smaller than a thickness of the insulating substrate.

Clause 6.

The semiconductor device according to clause 5, wherein the first bonding layer is located inward from a periphery of the insulating substrate as viewed in a thickness direction of the insulating element.

Clause 7.

The semiconductor device according to clause 6, wherein an area of the first bonding layer is smaller than an area of the second bonding layer as viewed in the thickness direction of the insulating element.

Clause 8.

The semiconductor device according to any one of clauses 5 to 7, wherein the first bonding layer and the second bonding layer have an electrically insulating property.

Clause 9.

The semiconductor device according to clause 1, wherein the insulating substrate is interposed between the die pad and the first semiconductor element, and the first semiconductor element is bonded to the insulating substrate.

Clause 10.

The semiconductor device according to clause 1, wherein the insulating substrate is interposed between the die pad and the second semiconductor element, and the second semiconductor element is bonded to the insulating substrate.

Clause 11.

The semiconductor device according to any one of clauses 1 to 10, wherein the insulating substrate is located inward from a periphery of the die pad as viewed in a thickness direction of the insulating element.

Clause 12.

The semiconductor device according to any one of clauses 1 to 11, wherein the insulating element is either of an inductive type or a capacitive type.

Clause 13.

The semiconductor device according to clause 12, wherein the insulating element includes a first transmitter/receiver electrically conducting to the first semiconductor element, a second transmitter/receiver electrically conducting to the second semiconductor element, and a relay unit that transmits/receives a signal between the first transmitter/receiver and the second transmitter/receiver, and the relay unit is located closer to the insulating substrate than are the first transmitter/receiver and the second transmitter/receiver in the thickness direction of the insulating element.

Clause 14.

The semiconductor device according to clause 12, wherein the insulating element includes a first insulating element and a second insulating element that are spaced apart from each other, the first insulating element includes: a first transmitter/receiver electrically conducting to the first semiconductor element; and a second transmitter/receiver that transmits/receives a signal to/from the first transmitter/receiver, the second insulating element includes: a third transmitter/receiver electrically conducting to the second transmitter/receiver; and a fourth transmitter/receiver that electrically conducts to the second semiconductor element and transmits/receives a signal to/from the third transmitter/receiver, and the second transmitter/receiver and the third transmitter/receiver are located closer to the insulating substrate than are the first transmitter/receiver and the fourth transmitter/receiver in the thickness direction of the insulating element.

Clause 15.

The semiconductor device according to any one of clauses 1 to 14, wherein a voltage applied to the second semiconductor element is higher than a voltage applied to the first semiconductor element.

Clause 16.

The semiconductor device according to clause 1, further comprising a sealing resin covering the first semiconductor element, the second semiconductor element, the insulating element and at least a part of each of the plurality of conductive members.

Clause 17.

The semiconductor device according to clause 16, wherein the first semiconductor element and the second semiconductor element are spaced apart from each other in a first direction, the plurality of conductive members include a plurality of first terminals exposed from one side of the sealing resin in the first direction and a plurality of second terminals exposed from the other side of the sealing resin in the first direction, the first semiconductor element electrically conducts to the plurality of first terminals, and the second semiconductor element electrically conducts to the plurality of second terminals.

Clause 18.

The semiconductor device according to clause 17, wherein the plurality of first terminals and the plurality of second terminals are arranged along a second direction orthogonal to the first direction.

Clause 19.

The semiconductor device according to clause 18, wherein the die pad includes a pad portion and two suspension lead portions connected to opposite ends in the second direction of the pad portion, the first semiconductor element and the second semiconductor element are located on the pad portion, and the two suspension lead portions are exposed from at least one of opposite sides in the first direction of the sealing resin.

REFERENCE NUMERALS

A1, A2, A3, A4, A5, A6: Semiconductor device
11: First semiconductor element 111: First electrode
12: Second semiconductor element 121: Second electrode
13: Insulating element 13A: first insulating element
13B: Second insulating element 131: First relay electrode
132: Second relay electrode 133: First transmitter/receiver
134: Second transmitter/receiver 135: Relay unit
136: Third relay electrode 137: Fourth relay electrode
138: Third transmitter/receiver
139: Fourth transmitter/receiver
20: Conductive member 21: Die pad
211: Pad portion 211A: Mounting surface
222: Suspension lead portion 222A: Covered portion
222B: Exposed portion 213: Through-hole
22: First die pad 221: First pad portion
221A: First mounting surface
222: First suspension lead portion
222A: Covered portion 222B: Exposed portion
223: Through-hole 23: Second die pad
231: Second pad portion 231A: Second mounting surface
232: Second suspension lead portion 232A: Covered portion
232B: Exposed portion 24: Insulating substrate
241: Periphery 25: First bonding layer
26: Second bonding layer 31: First terminal
31A: First intermediate terminal 31B: First-side terminal
311: Covered portion 312: Exposed portion
32: Second terminal 32A: Second intermediate terminal
32B: Second-side terminal 321: Covered portion
322: Exposed portion 41: First wire
42: Second wire 43: Third wire
44: Fourth wire 45: Fifth wire
50: Sealing resin 51: Top surface
52: Bottom surface 53: First side surface
531: First upper portion 532: First lower portion
533: First intermediate portion 54: Second side surface
541: Second upper portion 542: Second lower portion
543: Second intermediate portion T, t1, t2: Thickness
z: Thickness direction x: First direction
y: Second direction

The invention claimed is:

1. A semiconductor device comprising:

a plurality of conductive members including a die pad;

a first semiconductor element and a second semiconductor element each located on the die pad;

an insulating element electrically connected to the first semiconductor element and the second semiconductor element and insulating the first semiconductor element and the second semiconductor element from each other; and an insulating substrate interposed between the die pad and the insulating element and bonded to the die pad, wherein the insulating element is bonded to the insulating substrate.

2. The semiconductor device according to claim 1, wherein the die pad includes a first die pad and a second die pad that are spaced apart from each other;

the first semiconductor element is bonded to the first die pad, and the second semiconductor element is bonded to the second die pad.

3. The semiconductor device according to claim 2, wherein the insulating substrate is bonded to the first die pad.

4. The semiconductor device according to claim 2, wherein the insulating substrate is bonded to the second die pad.

5. The semiconductor device according to claim 1, further comprising:

a first bonding layer interposed between the die pad and the insulating substrate; and a second bonding layer interposed between the insulating substrate and the insulating element, wherein a thickness of each of the first bonding layer and the second bonding layer is smaller than a thickness of the insulating substrate.

6. The semiconductor device according to claim 5, wherein the first bonding layer is located inward from a periphery of the insulating substrate as viewed in a thickness direction of the insulating element.

7. The semiconductor device according to claim 6, wherein an area of the first bonding layer is smaller than an area of the second bonding layer as viewed in the thickness direction of the insulating element.

8. The semiconductor device according to claim 5, wherein the first bonding layer and the second bonding layer have an electrically insulating property.

9. The semiconductor device according to claim 1, wherein the insulating substrate is interposed between the die pad and the first semiconductor element, and the first semiconductor element is bonded to the insulating substrate.

10. The semiconductor device according to claim 1, wherein the insulating substrate is interposed between the die pad and the second semiconductor element, and the second semiconductor element is bonded to the insulating substrate.

11. The semiconductor device according to claim 1, wherein the insulating substrate is located inward from a periphery of the die pad as viewed in a thickness direction of the insulating element.

12. The semiconductor device according to claim 1, wherein the insulating element is either of an inductive type or a capacitive type.

13. The semiconductor device according to claim 12, wherein the insulating element comprises:

a first transmitter/receiver electrically conducting to the first semiconductor element, a second transmitter/receiver electrically conducting to the second semiconductor element, and a relay unit that transmits/receives a signal between the first transmitter/receiver and the second transmitter/receiver; and the relay unit is located closer to the insulating substrate than are the first transmitter/receiver and the second transmitter/receiver in the thickness direction of the insulating element.

14. The semiconductor device according to claim 12, wherein the insulating element incudes comprises:

a first insulating element and a second insulating element that are spaced apart from each other, the first insulating element comprises:

a first transmitter/receiver electrically conducting to the first semiconductor element, and a second transmitter/receiver that transmits/receives a signal to/from the first transmitter/receiver;

the second insulating element comprises:

a third transmitter/receiver electrically conducting to the second transmitter/receiver; and a fourth transmitter/receiver that electrically conducts to the second semiconductor element and transmits/receives a signal to/from the third transmitter/receiver; and the second transmitter/receiver and the third transmitter/receiver are located closer to the insulating substrate than are the first transmitter/receiver and the fourth transmitter/receiver in the thickness direction of the insulating element.

15. The semiconductor device according to claim 1, wherein a voltage applied to the second semiconductor element is higher than a voltage applied to the first semiconductor element.

16. The semiconductor device according to claim 1, further comprising:

a sealing resin covering the first semiconductor element, the second semiconductor element, the insulating element, and at least a part of each of the plurality of conductive members.

17. The semiconductor device according to claim 16, wherein the first semiconductor element and the second semiconductor element are spaced apart from each other in a first direction, the plurality of conductive members include a plurality of first terminals exposed from one side of the sealing resin in the first direction and a plurality of second terminals exposed from the other side of the sealing resin in the first direction, the first semiconductor element electrically conducts to the plurality of first terminals, and the second semiconductor element electrically conducts to the plurality of second terminals.

18. The semiconductor device according to claim 17, wherein the plurality of first terminals and the plurality of second terminals are arranged along a second direction orthogonal to the first direction.

19. The semiconductor device according to claim 18, wherein the die pad includes a pad portion and two suspension lead portions connected to opposite ends in the second direction of the pad portion, the first semiconductor element and the second semiconductor element are located on the pad portion, and the two suspension lead portions are exposed from at least one of opposite sides in the first direction of the sealing resin.

20. A semiconductor device comprising:

a plurality of conductive members including a die pad;

a first semiconductor element and a second semiconductor element that are each located on the die pad;

an insulating element that is electrically connected to the first semiconductor element and the second semiconductor element and that insulates the first semiconductor element and the second semiconductor element from each other;

an insulating substrate interposed between the die pad and the insulating element and bonded to the die pad;

a first bonding layer interposed between the die pad and the insulating substrate; and a second bonding layer interposed between the insulating substrate and the insulating element, wherein the insulating element is bonded to the insulating substrate via the second bonding layer.

* * * * *